(12) United States Patent
Masuda

(10) Patent No.: US 10,615,526 B2
(45) Date of Patent: Apr. 7, 2020

(54) SURFACE-MOUNT CONNECTOR, SURFACE-MOUNT CIRCUIT BOARD, AND METHOD OF MANUFACTURING SURFACE-MOUNT CIRCUIT BOARD

(71) Applicant: FUJITSU LIMITED, Kawasaki-shi, Kanagawa (JP)

(72) Inventor: Yasushi Masuda, Kawasaki (JP)

(73) Assignee: FUJITSU LIMITED, Kawasaki (JP)

(*) Notice: Subject to any disclaimer, the term of this patent is extended or adjusted under 35 U.S.C. 154(b) by 0 days.

(21) Appl. No.: 16/197,436

(22) Filed: Nov. 21, 2018

(65) Prior Publication Data
US 2019/0199022 A1  Jun. 27, 2019

(30) Foreign Application Priority Data
Dec. 22, 2017  (JP) ................. 2017-246721

(51) Int. Cl.
| | |
|---|---|
| *H01R 12/70* | (2011.01) |
| *H05K 3/34* | (2006.01) |
| *H05K 1/18* | (2006.01) |
| *H01R 12/71* | (2011.01) |
| *H01R 12/57* | (2011.01) |
| *H01R 12/58* | (2011.01) |
| *H01R 43/02* | (2006.01) |

(52) U.S. Cl.
CPC .......... *H01R 12/707* (2013.01); *H01R 12/57* (2013.01); *H01R 12/585* (2013.01); *H01R 12/7064* (2013.01); *H01R 12/714* (2013.01); *H01R 12/716* (2013.01); *H01R 43/0256* (2013.01); *H05K 1/181* (2013.01); *H05K 3/3405* (2013.01); *H05K 3/3415* (2013.01); *H05K 2201/10189* (2013.01)

(58) Field of Classification Search
CPC ................. H01R 12/526; H01R 12/707; H01R 43/0235; H01R 43/0256
USPC .................................. 439/83, 326, 328, 876
See application file for complete search history.

(56) References Cited

U.S. PATENT DOCUMENTS

| | | | | |
|---|---|---|---|---|
| 4,767,344 A | * | 8/1988 | Noschese | H01R 43/0235 228/180.1 |
| 5,975,921 A | * | 11/1999 | Shuey | H01R 12/724 174/263 |
| 6,095,857 A | * | 8/2000 | Isac | H01R 12/57 439/571 |
| 6,802,732 B1 | * | 10/2004 | Bu | H01R 12/7005 439/157 |
| 7,458,828 B2 | * | 12/2008 | Pavlovic | H01R 13/41 439/70 |
| 8,038,465 B2 | * | 10/2011 | Pavlovic | H01R 13/514 361/719 |

(Continued)

FOREIGN PATENT DOCUMENTS

| | | |
|---|---|---|
| JP | 11-238562 | 8/1999 |
| JP | 2001-283976 | 10/2001 |
| JP | 2003-272743 | 9/2003 |

*Primary Examiner* — Hien D Vu
(74) *Attorney, Agent, or Firm* — Fujitsu Patent Center

(57) ABSTRACT

A surface-mount connector includes, a connector body, connection terminals provided to the connector body that are placed on terminal solder portions on a surface of a circuit board, and a positioning portion provided to the connector body that includes a solder portion being press-fitted into a through-hole of the circuit board with the connection terminals placed on the terminal solder portions.

6 Claims, 26 Drawing Sheets

(56) References Cited

U.S. PATENT DOCUMENTS 8,753,138 B2 * 6/2014 Foster, Sr. ......... H01R 12/7029
439/160

* cited by examiner

SURFACE-MOUNT CONNECTOR, SURFACE-MOUNT CIRCUIT BOARD, AND METHOD OF MANUFACTURING SURFACE-MOUNT CIRCUIT BOARD

CROSS-REFERENCE TO RELATED APPLICATIONS

This application is based upon and claims the benefit of priority of the prior Japanese Patent Application No. 2017-246721, filed on Dec. 22, 2017, the entire contents of which are incorporated herein by reference.

FIELD

The embodiments discussed herein are related to a surface-mount connector, a surface-mount circuit board, and a method of manufacturing a surface-mount circuit board.

BACKGROUND

There is a fork terminal covered with solder, and including a pair of clamping portions for clamping a connection terminal.

Japanese Laid-open Patent Publication No. 2003-272743 discloses the related technology.

SUMMARY

According to an aspect of the embodiments, a surface-mount connector includes, a connector body, connection terminals provided to the connector body that are placed on terminal solder portions on a surface of a circuit board, and a positioning portion provided to the connector body that includes a solder portion being press-fitted into a through-hole of the circuit board with the connection terminals placed on the terminal solder portions.

The object and advantages of the invention will be realized and attained by means of the elements and combinations particularly pointed out in the claims. It is to be understood that both the foregoing general description and the following detailed description are exemplary and explanatory and are not restrictive of the invention.

DESCRIPTION OF EMBODIMENTS

There is a surface-mount connector which includes connection terminals to be joined to terminal solder portions (cream solders) on pads (conductor patterns) on a surface of a circuit board. The surface-mount connector is heated, for example, in a reflow furnace with the connection terminals placed on the terminal solder portions on the surface of the circuit board. Thereby, the connection terminals settle into the molten terminal solder portions. When the terminal solder portions harden in this state, the connection terminals are joined (bonded) to the terminal solder portions.

In some cases, the surface-mount connector is provided with a fork lock which is press-fitted into a through-hole of a circuit board to inhibit the connection terminals from being out of alignment with the terminal solder portions. The fork lock includes a pair of lock arm portions which are elastically deformed in a way that makes the interval between the lock arm portions narrow when the fork lock is press-fitted into the through-hole of the circuit board. The pair of lock arm portions are brought into press contact with an inner circumferential surface of the through-hole, and the connection terminals are thereby inhibited from being out of alignment with the terminal solder portions.

However, the pressure contact of the pair of lock arm portions with the inner circumferential surface of the through-hole of the circuit board restricts the vertical movement of the surface-mount connector. For this reason, even in the case where the terminal solder portions melt in the reflow furnace, there is likelihood that: the connection terminals have difficulty in settling into the terminal solder portions; and the connection terminals are inappropriately joined to the terminal solder portions.

Descriptions will be hereinbelow provided for embodiments of the technology disclosed in the present application.

First Embodiment

First of all, descriptions will be provided for a first embodiment.
(Surface-Mount Connector)

Figure 1:
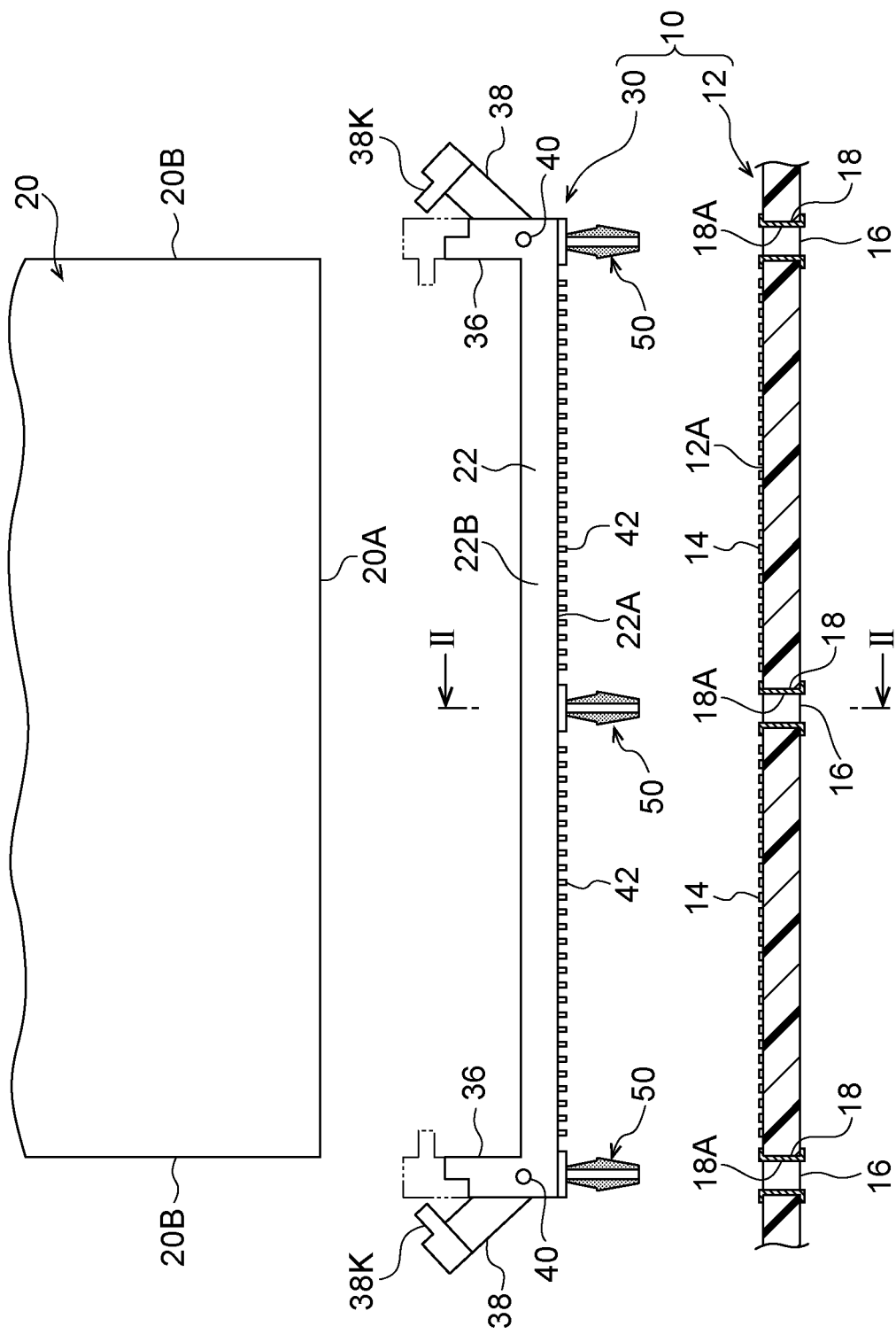
FIG. 1 is a front view illustrating how a surface-mount connector and a surface-mount circuit board according to a first embodiment are separated from each other.

As illustrated in FIG. 1, a surface-mount connector (SMT connector) 30 according to the first embodiment is mounted on a surface (mount surface) 12A of a circuit board 12. The circuit board 12 is formed from resin or the like, and in the shape of a board. The circuit board 12 is a printed circuit board obtained by printing multiple terminal solder portions 14 on the surface 12A. A plate-shaped memory 20 is detachably attached to the surface-mount connector 30.

The memory 20 is an example of an electronic device. In the first embodiment, the circuit board 12 with the surface-mount connector 30 mounted on (joined to) the surface 12A is referred to as a surface-mount circuit board 10.

Figure 2:
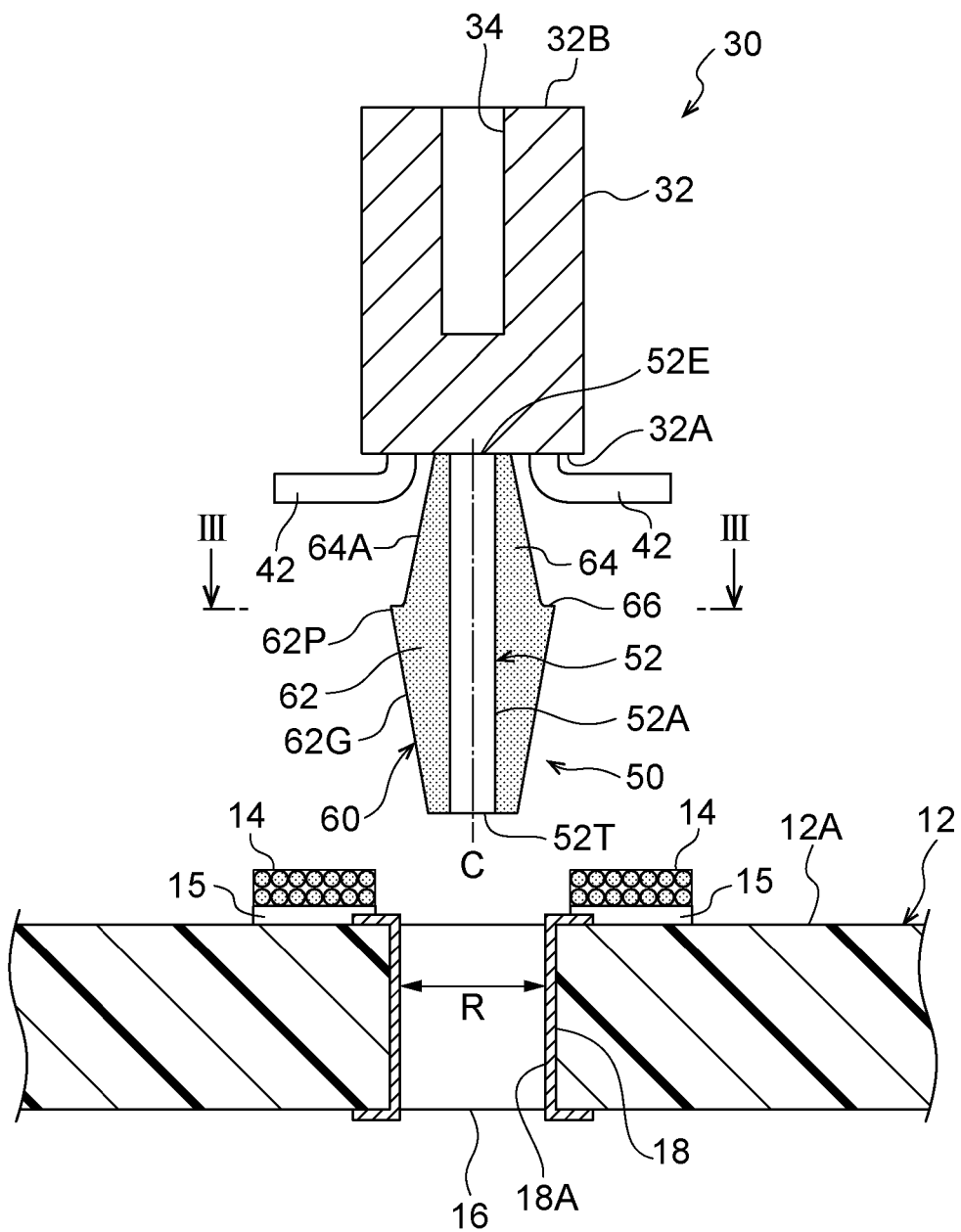
FIG. 2 is a cross-sectional view taken along the II-II line of FIG. 1.

The surface-mount connector 30 includes a connector body 32, multiple connection terminals 42, and multiple positioning portions 50. The connector body 32 is formed, for example, from resin or the like, and in the shape of a bar. As illustrated in FIG. 2, a transverse cross section of the connector body 32 is formed in the shape of a rectangle. The connector body 32 includes: a facing surface 32A facing the surface 12A of the circuit board 12; and an attachment surface 32B which is an opposite side of the connection main body from the facing surface 32A.

An attachment portion 34 to which to detachably attach the memory 20 is formed in the attachment surface 32B. The attachment portion 34 is formed in the shape of a groove, which extends in a longitudinal direction of the connector body 32. An end portion 20A (see FIG. 1) of the memory 20, which is a portion extending in a direction orthogonal to the longitudinal direction of the memory 20, is inserted in the attachment portion 34. Connecting portions to be electrically connected to signal lines (not illustrated) formed in the end portion 20A of the memory 20 are provided to inner wall surfaces of the attachment portion 34.

As illustrated in FIG. 1, retaining portions 36 for retaining the memory 20 are respectively provided to two longitudinal end portions of the connector body 32. The retaining portions 36 are arranged along two longitudinal end portions 20B of the memory 20. The retaining portions 36 include slits (not illustrated) formed therein in which to insert the end portions 20B of the memory 20. The retaining portions 36 are provided with release levers 38, respectively.

(Release Levers)

The release levers 38 are connected to the retaining portions 36 with the assistance of turning shafts 40, respectively. The release levers 38 have claw portions 38K, respectively. As drawn with chain double-dashed lines, the release levers 38 turn around the respective turning shafts 40 once the memory 20 is attached to the attachment portion 34 of the connector body 32. Thereby, the claw portions 38K of the release levers 38 come into engagement with engagement portions (not illustrated) formed in the end portions 20B of the memory 20. The claw portions 38K inhibit the memory 20 from coming off the attachment portion 34 of the connector body 32.
(Connection Terminals)

As illustrated in FIG. 2, multiple pairs of connection terminals 42 are provided to the facing surface 32A of the connector body 32. Each connection terminal 42 in each pair is a lead terminal bent in the shape of the letter L. The connection terminals 42 in each pair are arranged in the opposite directions. The connection terminals 42 in each pair extend from the facing surface 32A of the connector body 32 toward two sides in the thickness direction of the connector body 32. As illustrated in FIG. 1, the multiple pairs of connection terminals 42 are arranged with a space between each two neighboring connection terminals in the longitudinal direction of the connector body 32.

As illustrated in FIG. 2, the connection terminals 42 are connected to pads (conductor patterns) 15 provided on the surface 12A of the circuit board 12 with the terminal solder portions 14 in between. The pads 15 are formed, for example, from copper or the like. The terminal solder portions 14 are formed, for example, from cream solder, and cover the surfaces of the pads 15. The terminal solder portions 14 melt when heated at or above a predetermined temperature. The pads 15 and the terminal solder portions 14 are arranged depending on the arrangement of the multiple connection terminals 42 of the connector body 32. When the facing surface 32A of the connector body 32 is placed opposite to the surface 12A of the circuit board 12, the multiple connection terminals 42 are brought into contact with the multiple terminal solder portions 14.
(Positioning Portions)

As illustrated in FIG. 1, the multiple positioning portions 50 are provided to the facing surface 32A of the connector body 32. The multiple positioning portions 50 are provided there: two respectively in the two longitudinal end portions of the connector body 32 and one in a longitudinal middle portion thereof. The positioning portions 50 are arranged in a way that the positioning portions 50 do not contact the multiple connection terminals 42. For example, the positioning portions 50 are placed out of the multiple connection terminals 42 in the longitudinal direction of the connector body 32.

As illustrated in FIG. 2, each positioning portion 50 includes a stem portion 52 and a cover portion 60. The stem portion 52 is formed, for example, from metal, resin or the like, and in the shape of a column. The stem portion 52 extends from the facing surface 32A of the connector body 32. The stem portion 52 is inserted into a through-hole 16 formed in the surface 12A of the circuit board 12.

The through-hole 16 is a column-shaped hole penetrating through the circuit board 12 in the thickness direction of the circuit board. The inner circumferential surface of the through-hole 16 is covered with a metal film 18. The metal film 18 is formed, for example, by plating or the like.

Figure 3:
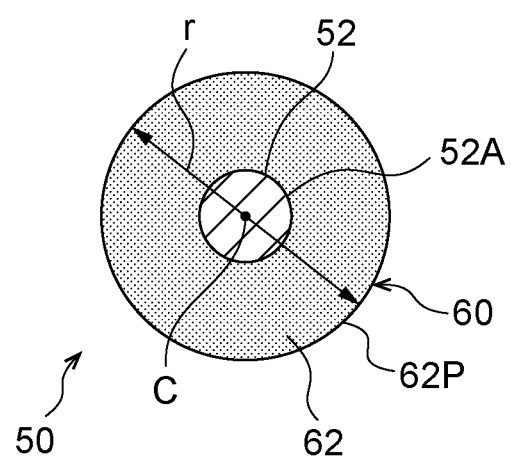
FIG. 3 is a cross-sectional view taken along the III-III line of FIG. 2.

An outer circumferential surface 52A of the stem portion 52 is covered with the cover portion 60. The cover portion 60 is formed from solder, and melts when heated at or above a predetermined temperature. The cover portion 60 is molded integrally with the stem portion 52, for example, by insert molding. As illustrated in FIG. 3, the cover portion 60 is formed in the shape of a cylinder in a way that makes the cover portion 60 surround the stem portion 52.

As illustrated in FIG. 2, the cover portion 60 includes a distal end-side taper portion 62 and a base end-side taper portion 64. The distal end-side taper portion 62 and the base end-side taper portion 64 are arranged in a line in a direction of a center axis C of the stem portion 52. The distal end-side taper portion 62 is arranged in a distal end portion 52T of the stem portion 52. The base end-side taper portion 64 is arranged in a base end portion 52E of the stem portion 52.

The distal end-side taper portion 62 tapers toward the distal end portion 52T of the stem portion 52. The distal end-side taper portion 62 is inserted into the through-hole 16 of the circuit board 12. The outer circumferential surface of the distal end-side taper portion 62 is a guide surface 62G. In a vertical cross section of the distal end-side taper portion 62, the guide surface 62G inclines to the center axis C of the stem portion 52 toward the distal end portion 52T of the stem portion 52. The guide surface 62G guides the insertion of the distal end-side taper portion 62 into the through-hole 16.

The distal end-side taper portion 62 is an example of a solder portion and an example of a taper portion. The guide surface 62G is an example of a guide portion.

An end portion of the distal end-side taper portion 62 on the side of the base end portion 52E of the stem portion 52 is a press-contact portion 62P. An outer diameter r (see FIG. 3) of the press-contact portion 62P is slightly larger than an inner diameter R of the through-hole 16. The press-contact portion 62P is press-fitted into and squeezed inside the through-hole 16. Thereby, the press-contact portion 62P is brought into press contact with an inner circumferential surface 18A of the through-hole 16, and the surface-mount connector 30 is thus fixed to the circuit board 12.

The base end-side taper portion 64 tapers toward the base end portion 52E of the stem portion 52. In a vertical cross section of the base end-side taper portion 64, an outer circumferential surface 64A of the base end-side taper portion 64 inclines to the center axis C of the stem portion 52 toward the base end portion 52E of the stem portion 52. The base end-side taper portion 64 tapers in a direction opposite to the direction in which the distal end-side taper portion 62 tapers. The base end-side taper portion 64 is not inserted into the through-hole 16 of the circuit board 12.

The outer diameter of the end portion of the base end-side taper portion 64 on the side of the distal end-side taper portion 62 is smaller than the outer diameter r (see FIG. 3) of the press-contact portion 62P of the distal end-side taper portion 62. Thereby, a step portion 66 is formed between the base end-side taper portion 64 and the press-contact portion 62P. This makes the press-contact portion 62P easy to squeeze toward the step portion 66 when the press-contact portion 62P is press-fitted into the through-hole 16.

(Method of Manufacturing Surface-Mount Circuit Board)

Next, descriptions will be provided for an example of a method of manufacturing the surface-mount circuit board 10.

To begin with, a worker places the circuit board 12 on a stand (not illustrated) with the surface 12A of the circuit board 12 faced upward as illustrated in FIG. 2. Instead of the worker, a machine such as a robot may perform this work when deemed appropriate.

Figure 4:
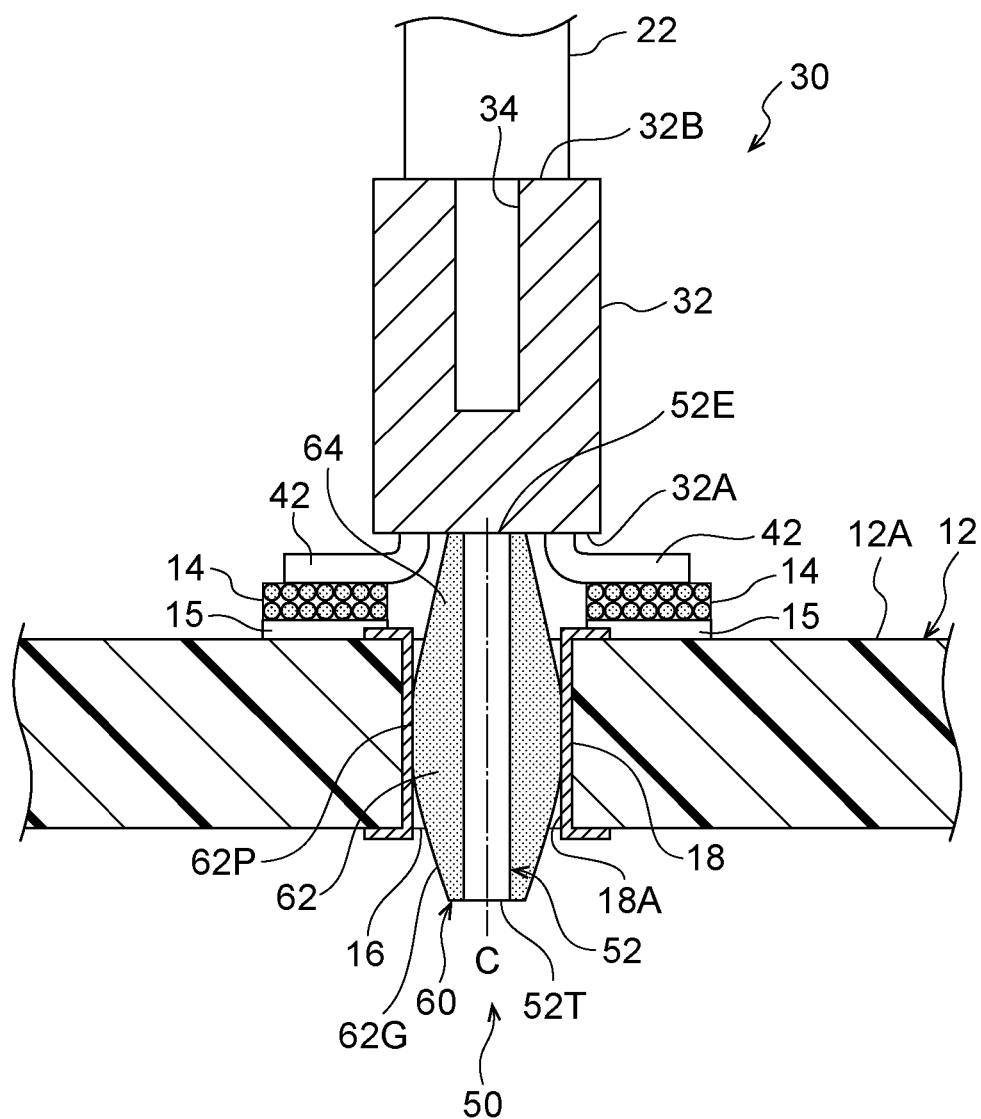
FIG. 4 is a cross-sectional view illustrating how a positioning portion illustrated in FIG. 2 is press-fitted into a through-hole of the circuit board.

Next, as illustrated in FIG. 4, the worker arranges the surface-mount connector 30 on the circuit board 12 with the facing surface 32A of the connector body 32 faced downward. With the facing surface 32A of the connector body 32 faced downward, the worker places the multiple connection terminals 42 of the surface-mount connector 30 on the multiple terminal solder portions 14 on the surface 12A of the circuit board 12, respectively.

When doing so, the worker press-fits the distal end-side taper portions 62 of the multiple positioning portions 50 into the multiple through-holes 16 of the circuit board 12, respectively. Thereby, the press-contact portion 62P of each distal end-side taper portion 62 is squeezed inside the corresponding through-hole 16, and is brought into press contact with the inner circumferential surface 18A of the through-hole. Thus, the surface-mount connector 30 is fixed to the circuit board 12, and the connection terminals 42 are inhibited from being out of alignment with the terminal solder portions 14 (in a horizontal direction).

Thereafter, the worker places a weight 22 on the attachment surface 32B of the connector body 32. The circuit board 12 and the surface-mount connector 30, as being in this state, are conveyed into a reflow furnace (not illustrated). The circuit board 12 and the surface-mount connector 30 are heated to a predetermined temperature by the reflow furnace.

Figure 5:
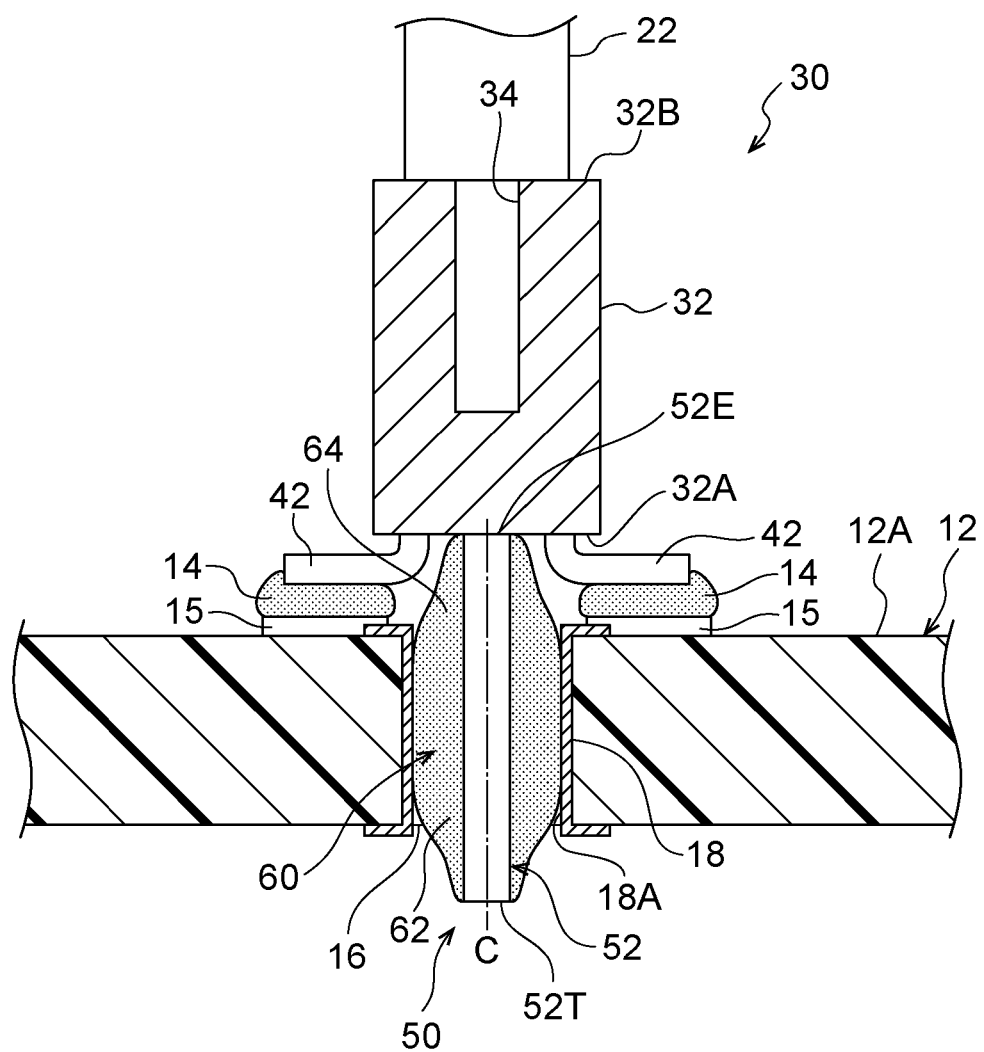
FIG. 5 is a cross-sectional view illustrating how a solder portion and terminal solder portions illustrated in FIG. 4 melt.
Figure 6:
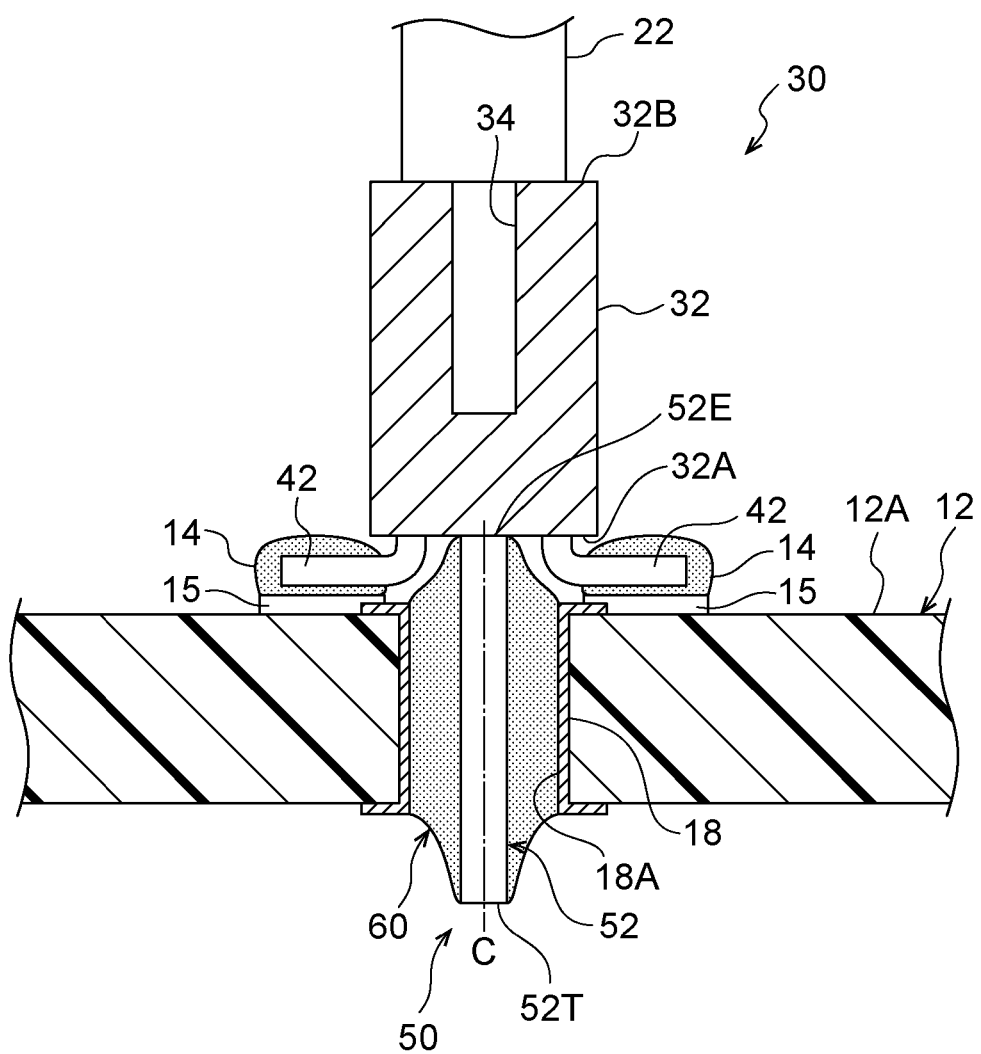
FIG. 6 is a cross-sectional view illustrating how the solder portion and the terminal solder portions illustrated in FIG. 5 harden.

Thereby, as illustrated in FIG. 5, the terminal solder portions 14 on the pads 15 on the circuit board 12 melt. The cover portion 60 (the distal end-side taper portion 62) of each positioning portion 50 melts, and the surface-mount connector 30 is unfixed from the circuit board 12. Thus, as illustrated in FIG. 6, the stem portion 52 of each positioning portion 50 falls inside the corresponding through-hole 16 due to the weights of the weight 22 and the surface-mount connector 30. Because of the weights of the weight 22 and the surface-mount connector 30, the connection terminals 42 settle into the terminal solder portions 14 to an extent that, for example, the connection terminals come into contact with the surfaces of the pads 15.

After that, the circuit board 12 and the surface-mount connector 30 are put out of the reflow furnace, and the terminal solder portions 14 harden. Thus, the connection terminals 42 are joined (bonded) to the terminal solder portions 14. Thereby, the connection terminals 42 are electrically connected to the pads 15 with the terminal solder portions 14 in between. The cover portions 60 of the positioning portions 50 harden, and the stem portions 52 are joined (bonded) to the inner circumferential surfaces 18A of the through-holes 16 with the cover portions 60 (the distal end-side taper portions 62) in between. With this, the surface-mount circuit board 10 is manufactured.

The weight 22 may be omitted.

(Working and Effects)

Next, descriptions will be provided for working and effects of the first embodiment.

In the first embodiment, the distal end-side taper portions 62 of the positioning portions 50 are press-fitted into the through-holes 16 of the circuit board 12. Thereby, the press-contact portions 62P of the distal end-side taper portions 62 are brought into press contact with the inner circumferential surfaces 18A of the through-holes 16. The press-contact portions 62P fix the surface-mount connector 30 to the circuit board 12.

For this reason, for example, even if a hand of the worker touches the surface-mount connector 30 while placing the weight 22 on the attachment surface 32B of the connector body 32, the connection terminals 42 are inhibited from coming out of alignment with the terminal solder portions 14. Thus, the terminal solder portions 14 are inhibited from being inappropriately joined to the connection terminals 42.

Each distal end-side taper portion 62 tapers toward the distal end portion 52T of the stem portion 52. This makes it easy for the worker to insert the distal end-side taper portion 62 into the corresponding through-hole 16.

The step portion 66 is formed between the press-contact portion 62P of each distal end-side taper portion 62 and the corresponding base end-side taper portion 64. The step portion 66 makes the press-contact portion 62P easy to squeeze toward the step portion 66 when the distal end-side taper portion 62 is press-fitted into the through-hole 16. This makes it easy for the worker to press-fit the distal end-side taper portions 62 into the through-hole 16.

The cover portions 60 melt when heated at or above the predetermined temperature by the reflow furnace. Thereby, the surface-mount connector 30 is unfixed from the circuit board 12. Thus, due to the weights of the weight 22 and the surface-mount connector 30, the connection terminals 42 easily settle into the terminal solder portions 14. Accordingly, the connection terminals 42 are inhibited from being inappropriately joined to the terminal solder portions 14.

In the first embodiment, the circuit board 12 and the surface-mount connector 30 are heated by the reflow furnace with the weight 22 placed on the attachment surface 32B of the connector body 32. Thereby, the weight of the weight 22 makes it easier for the connection terminals 42 to settle into the terminal solder portions 14. The weight of the weight 22 further inhibits a warp (thermal deformation) and the like of the connector body 32.

When the cover portions 60 of the positioning portions 50 are cooled, the cover portions 60 are joined to the inner circumferential surfaces 18A of the through-holes 16. This increases the strength of boding between the circuit board 12 and the surface-mount connector 30. Thus, the connection terminals 42 are inhibited from coming off the terminal solder portions 14.

(Modifications of First Embodiment)

Next, descriptions will be provided for modifications of the first embodiment.

In the first embodiment, each cover portion 60 is provided with the distal end-side taper portion 62 and the base end-side taper portion 64. However, the solder portion may be formed, for example, in the shape of a cylinder, instead of tapering.

In the first embodiment, the transverse cross section of the cover portion 60 is formed in the shape of a circle. However, the transverse cross section of the solder portion may be formed in the shape of an ellipse or a polygon including a triangle. Similarly, each stem portion may be formed in the shape of an ellipse or a polygon including a triangle.

Second Embodiment

Next, descriptions will be provided for a second embodiment. In the second embodiment, components which are the same as those of the first embodiment are denoted by the same reference signs, and descriptions will be omitted whenever deemed appropriate.

Figure 7:
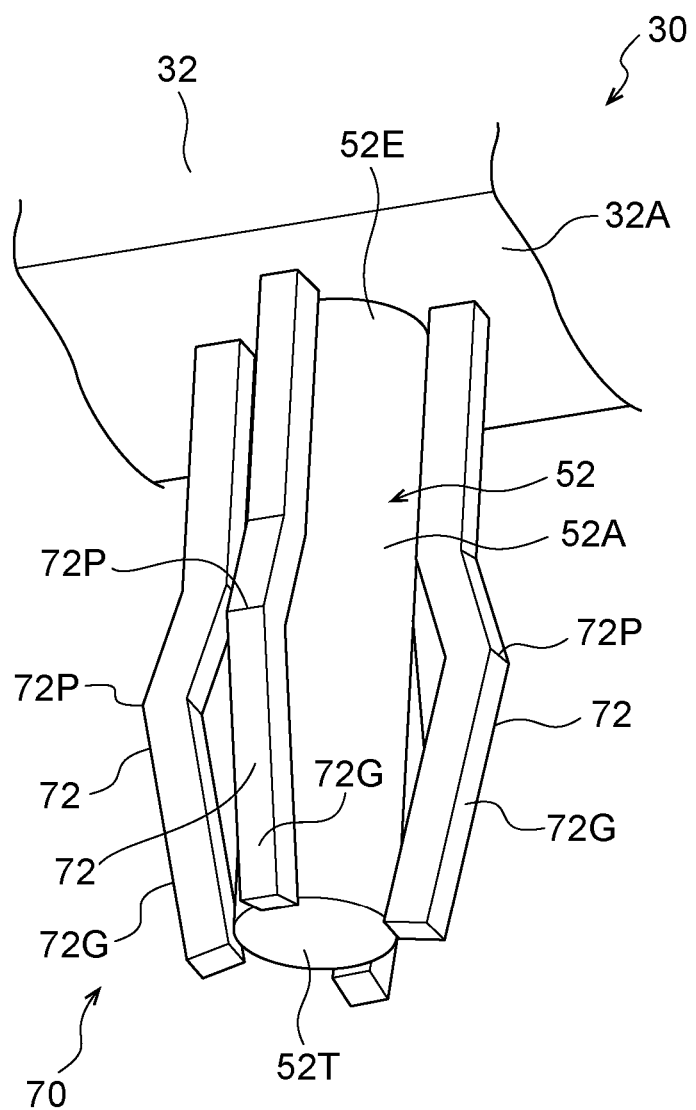
FIG. 7 is a perspective view illustrating a positioning portion of a surface-mount connector according to a second embodiment.
Figure 8:
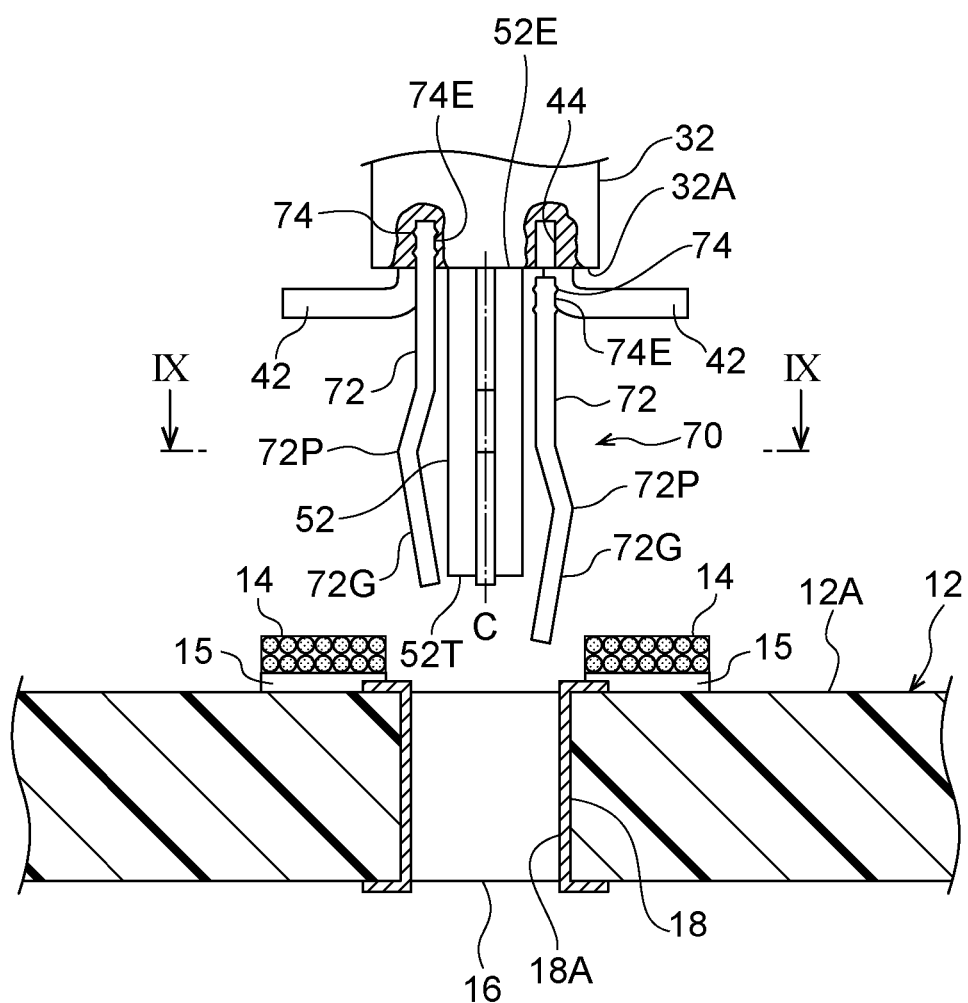
FIG. 8 is a cross-sectional view illustrating the positioning portion illustrated in FIG. 7, and corresponding to FIG. 2.

As illustrated in FIGS. 7 and 8, each positioning portion 70 according to the second embodiment includes the stem portion 52, and multiple arm portions 72. The multiple arm portions 72 extend from the facing surface 32A of the connector body 32 along the stem portion 52. The multiple arm portions 72 are arranged around the stem portion 52.

Figure 9:
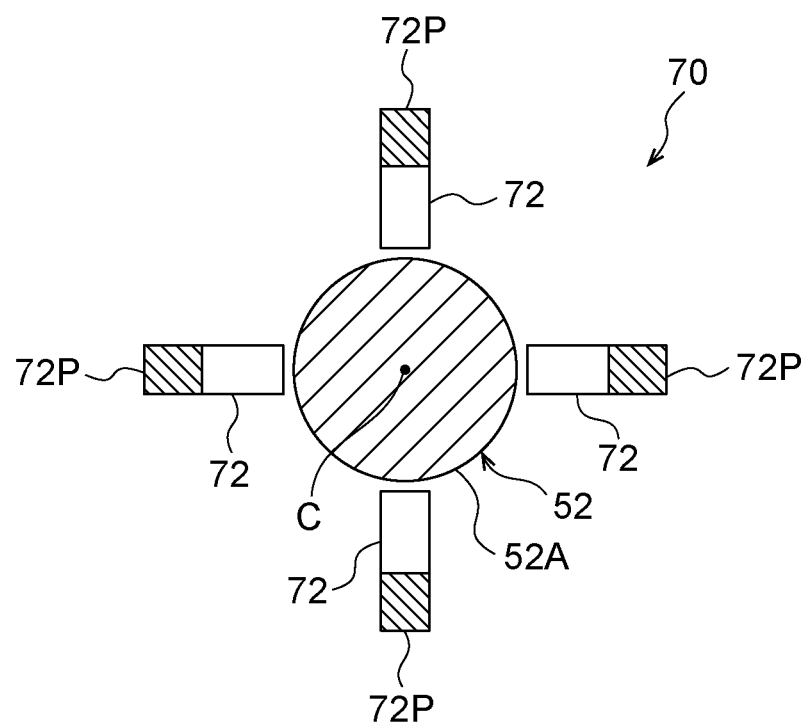
FIG. 9 is a cross-sectional view taken along the IX-IX line of FIG. 8.
Figure 10:
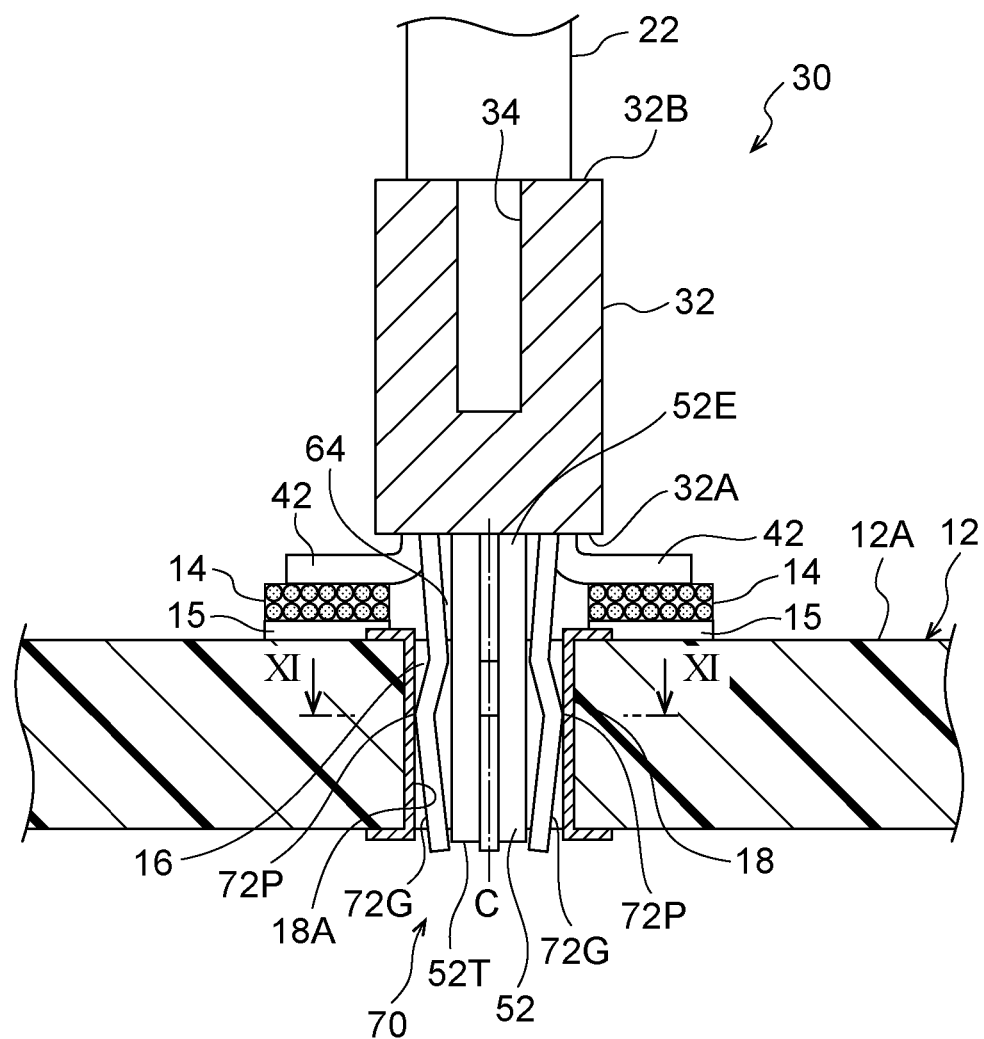
FIG. 10 is a cross-sectional view illustrating how the positioning portion illustrated in FIG. 8 is press-fitted into the through-hole of the circuit board.

For example, as illustrated in FIG. 9, the multiple arm portions 72 are arranged at equal intervals around the stem portion 52. The multiple arm portions 72 are arranged with a space between each of arm portions and the stem portion 52. As illustrated in FIG. 10, the arm portions 72 are press-fitted into the through-hole 16 with the connection terminals 42 of the connector body 32 placed on the terminal solder portions 14 on the circuit board 12. Each of arm portions 72 is elastically deformed toward the stem portion 52 when press-fitted into the through-hole 16.

In the second embodiment, four arm portions 72 are provided around the stem portion 52. Each two arm portions 72 are arranged facing each other with the stem portion 52 in between. All the arm portions 72 have the same configuration.

As illustrated in FIG. 8, the arm portions 72 are formed by blanking a solder plate made of solder. A base end portion 72E of each of arm portions 72 on the side of the connector body 32 is fixed to the connector body 32.

For example, the base end portion 72E of each of arm portions 72 is provided with multiple protrusions (bulge portions) 74. Multiple attachment holes 44 are formed in the facing surface 32A of the connector body 32. The base end portion 72E and the multiple protrusions 74 of each of arm portions 72 are press-fitted into the corresponding attachment hole 44. Thereby, the arm portion 72 is fixed to the connector body 32.

Figure 11:
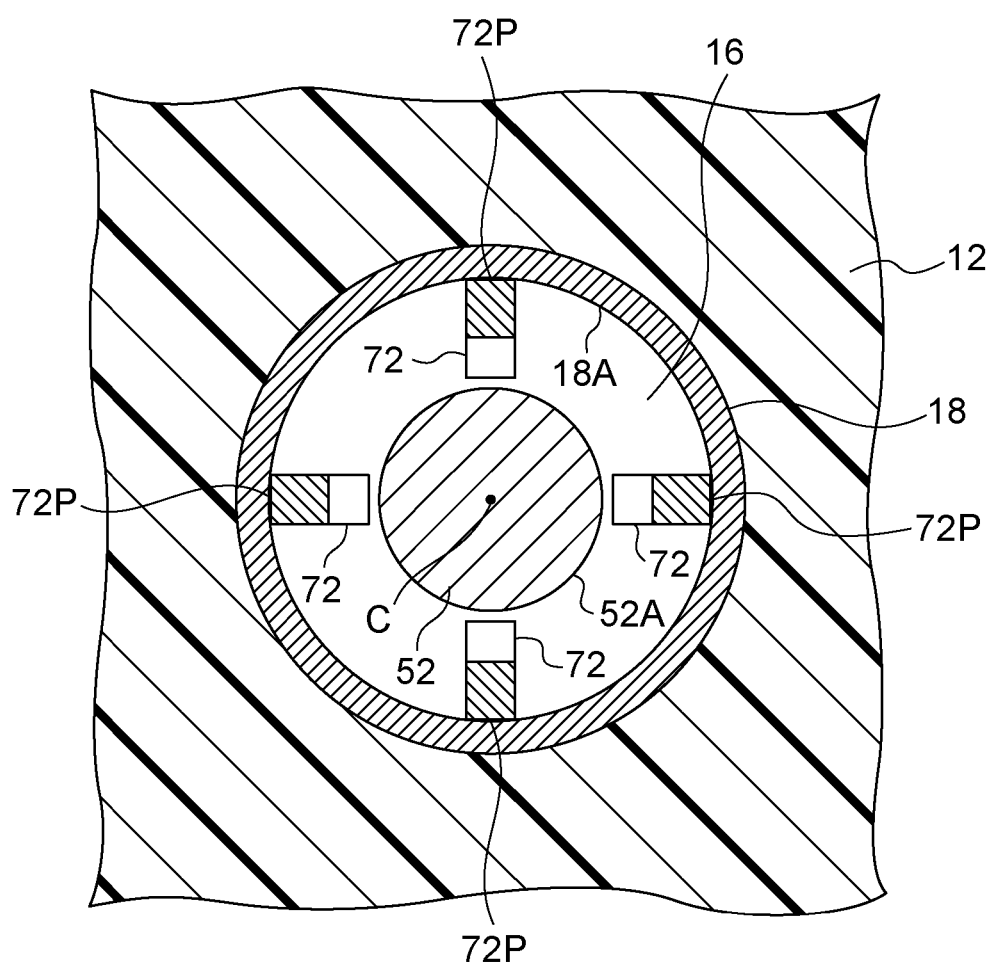
FIG. 11 is a cross-sectional view taken along the XI-XI line of FIG. 10.

Each of arm portions 72 includes a bent portion 72P and an inclination portion 72G. The bent portion 72P is formed by bending out the arm portion 72 in a direction away from the stem portion 52. As illustrated in FIG. 11, the bent portion 72P is brought into press contact with the inner circumferential surface 18A of the through-hole 16. The bent portion 72P is an example of the press-contact portion.

As illustrated in FIG. 8, a portion of each of arm portions 72 from the bent portion 72P to the distal end portion 72T is the inclination portion 72G. The inclination portion 72G extends from the bent portion 72P toward the distal end portion 52T of the stem portion 52. The inclination portion 72G inclines to the center axis C of the stem portion 52 toward the distal end portion 52T of the stem portion 52 from the bent portion 72P. The inclination portion 72G guides the insertion of the arm portion 72 into the through-hole 16.

The arm portions 72 are an example of the solder portion. The inclination portion 72G is an example of the guide portion.

(Working and Effects)

Next, descriptions will be provided for working and effects of the second embodiment.

In the second embodiment, the multiple arm portions 72 are provided around the stem portion 52 of each positioning portion 70. As FIGS. 10 and 11, the multiple arm portions 72 are press-fitted into the through-hole 16 with the connection terminals 42 of the connector body 32 placed on the terminal solder portions 14. Thereby, each of arm portions 72 is elastically deformed toward the stem portion 52, and the bent portion 72P of the arm portion 72 is brought into press contact with the inner circumferential surface 18A of the through-hole 16. These bent portions 72P fix the connector body 32 to the circuit board 12. Thus, before the reflowing of the circuit board 12 and the surface-mount connector 30, the connection terminals 42 are inhibited from being out of alignment with the terminal solder portions 14.

Each of arm portions 72 is provided with the inclination portion 72G which extends from the bent portion 72P toward the distal end portion 52T of the stem portion 52. This makes it easy for the multiple arm portions 72 to be inserted into the through-hole 16.

Each of arm portions 72 is arranged around the stem portion 52 with a space between the arm portion and the stem portion 52. This makes it easy for the multiple arm portions 72 to be elastically deformed toward the stem portion 52 when the multiple arm portions are press-fitted into the through-hole 16. Accordingly, the worker easily press-fits the multiple arm portions 72 into the through-hole 16.

The multiple arm portions 72 melt when heated at or above the predetermined temperature in the reflow furnace. This unfixes the surface-mount connector 30 from the circuit board 12. Thus, the connection terminals 42 easily settle into the terminal solder portions 14 due to the weight of the weight 22 and the surface-mount connector 30. Accordingly, the connection terminals 42 are inhibited from being inappropriately joined to the terminal solder portions 14.

When the multiple arm portions 72 are cooled, the arm portions 72 are joined to the inner circumferential surfaces 18A of the through-holes 16. This increases the strength of boding between the circuit board 12 and the surface-mount connector 30. Thus, the connection terminals 42 are inhibited from coming off the terminal solder portions 14.

(Modifications of Second Embodiment)

Next, descriptions will be provided for modifications of the second embodiment.

In the second embodiment, the four arm portions 72 are arranged around each stem portion 52. Instead, however, at least two arm portions may be arranged around the stem portion 52. In the second embodiment, the arm portions 72 are arranged at their respective positions away from the stem portion 52. Instead, however, the arm portions may be in contact with the stem portion.

In the second embodiment, the portion of each of arm portions 72 from the bent portion 72P to the distal end portion 72T inclines. However, the portion of the arm portion 72 from the bent portion 72P to the distal end portion 72T may be arranged in the direction of the center axis C of the stem portion 52 instead of inclining. Furthermore, the stem portion 52 may be omitted.

Third Embodiment

Next, descriptions will be provided for a third embodiment. In the third embodiment, components which are the same as those of the first and second embodiments are denoted by the same reference signs, and descriptions will be omitted whenever deemed appropriate.

Figure 12:
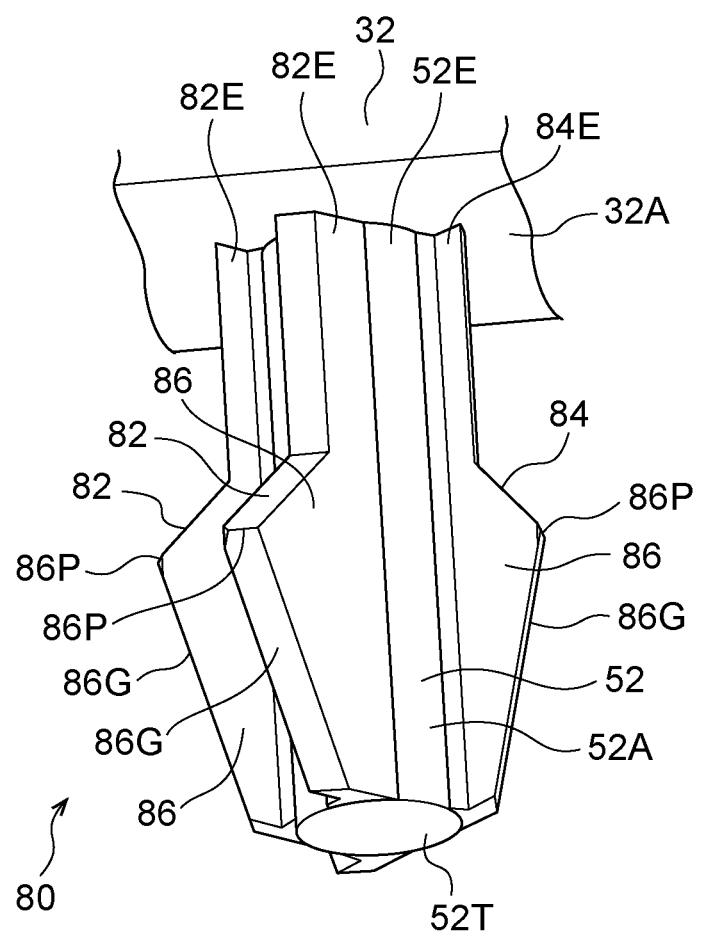
FIG. 12 is a perspective view illustrating a positioning portion of a surface-mount connector according to a third embodiment.
Figure 13:
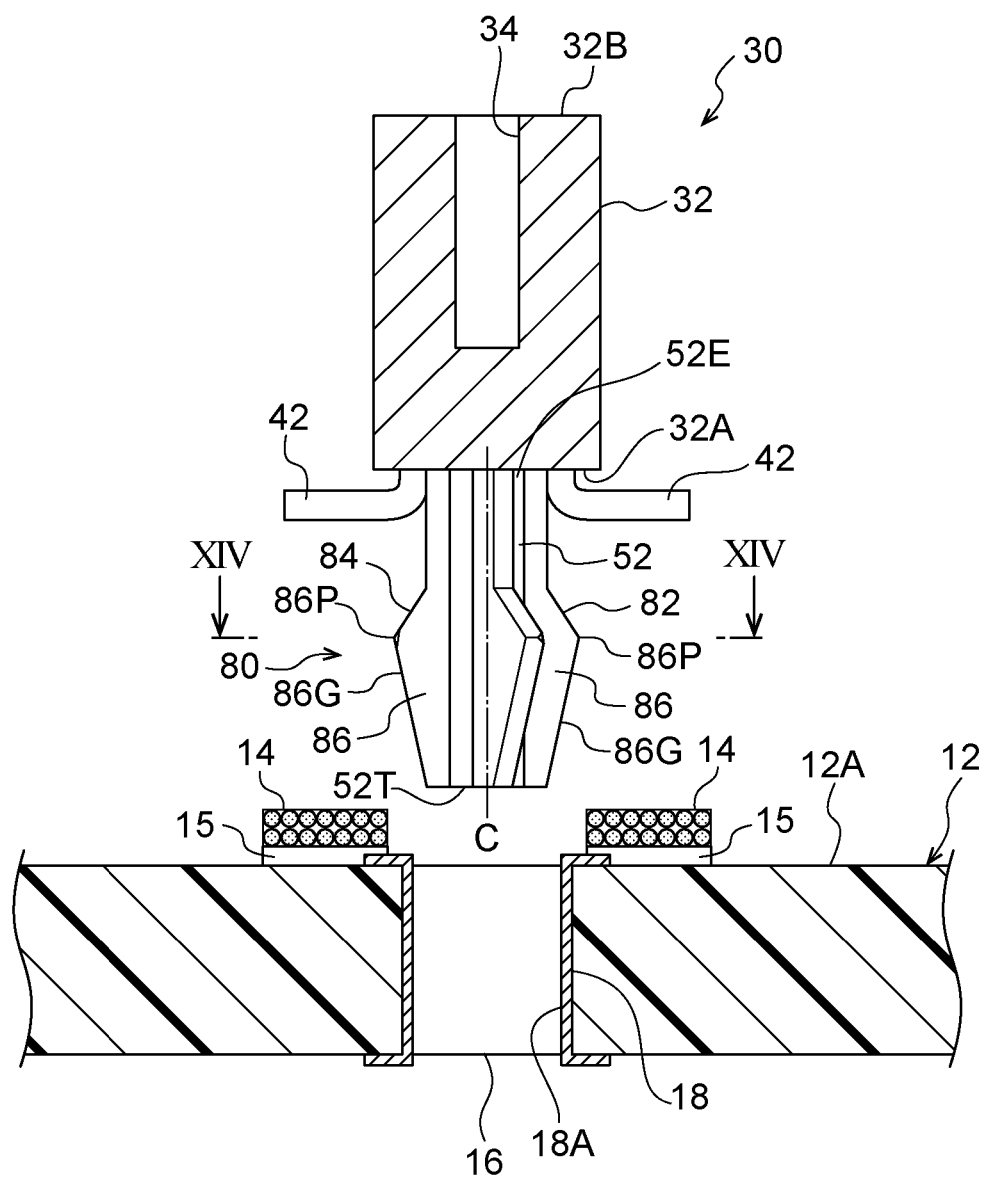
FIG. 13 is a cross-sectional view illustrating the positioning portion illustrated in FIG. 12, and corresponding to FIG. 2.
Figure 14:
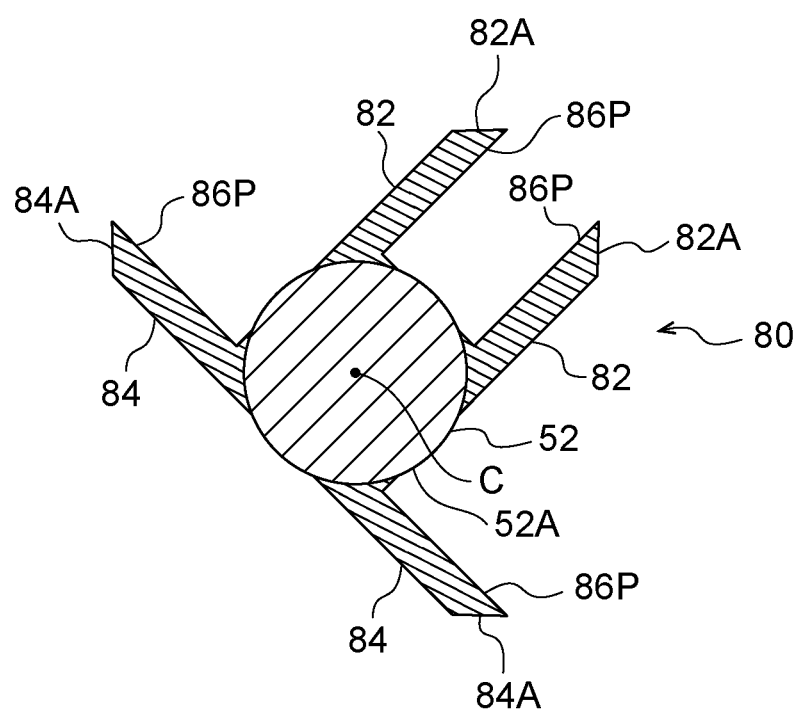
FIG. 14 is a cross-sectional view taken along the XIV-XIV line of FIG. 13.

As illustrated in FIGS. 12 to 14, each positioning portion 80 according to the third embodiment includes the stem portion 52, a pair of first wall-shaped portions 82, and a pair of second wall-shaped portions 84. The pair of first wall-shaped portions 82 and the pair of second wall-shaped portions 84 are examples of a wall-shaped portion and the solder portion.

The pair of first wall-shaped portions 82 and the pair of second wall-shaped portions 84 extend along the stem portion 52 from the facing surface 32A of the connector body 32. For example, the pair of first wall-shaped portions 82 and the pair of second wall-shaped portions 84 extend in the direction of the center axis C of the stem portion 52. The pair of first wall-shaped portions 82 and the pair of second wall-shaped portions 84 are arranged around the stem portion 52.

Figure 15:
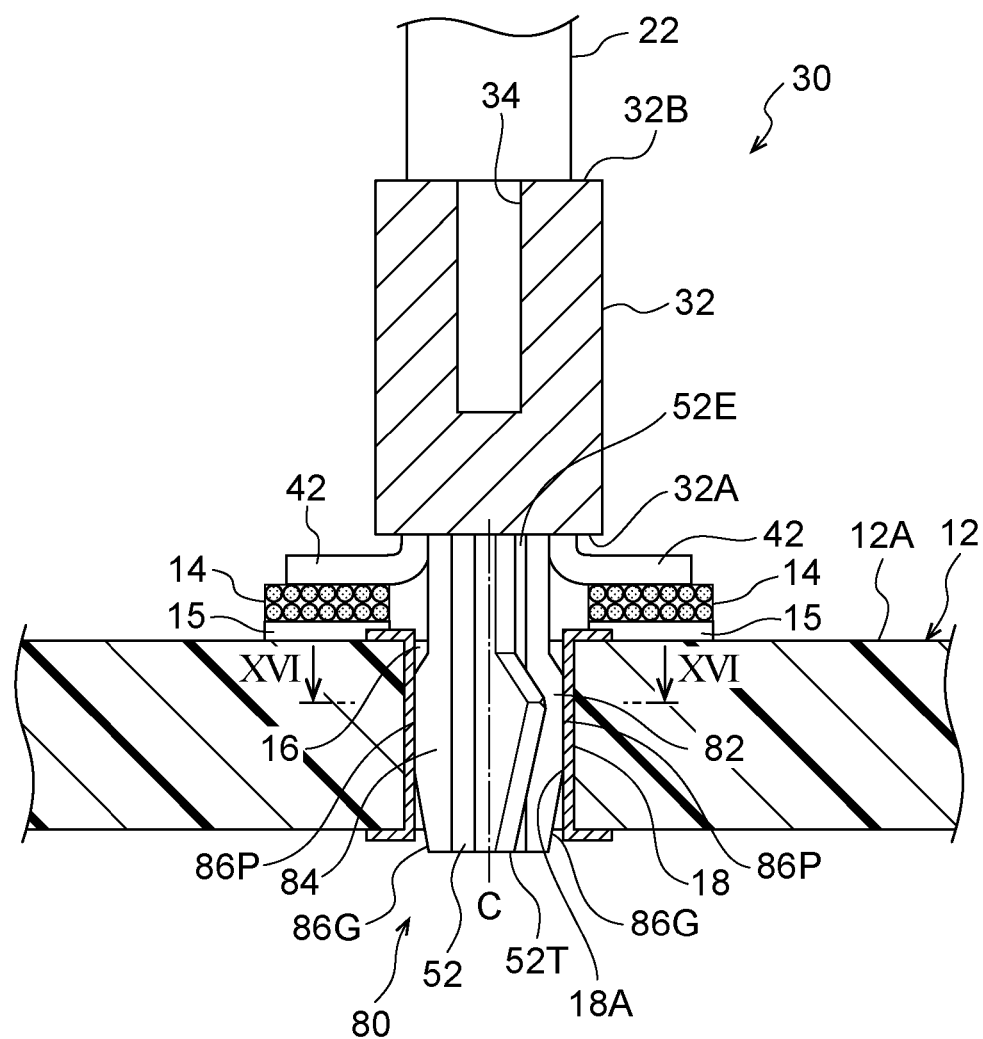
FIG. 15 is a cross-sectional view illustrating how the positioning portion illustrated in FIG. 13 is press-fitted into the through-hole of the circuit board.

As illustrated in FIG. 15, the pair of first wall-shaped portions 82 and the pair of second wall-shaped portions 84 are press-fitted into the through-hole 16 with the connection terminals 42 of the connector body 32 placed on the terminal solder portions 14 of the circuit board 12. The pair of first wall-shaped portions 82 and the pair of second wall-shaped portions 84 are formed by, for example, by blanking a solder plate made of solder. Base end portions 82E of the pair of first wall-shaped portions 82 on the side of the connector body 32 and base end portions 84E of the pair of second wall-shaped portions 84 on the side of the connector body 32 are fixed to the connector body 32.

The base end portions 82E of the pair of first wall-shaped portions 82 and the base end portions 84E of the pair of second wall-shaped portions 84 (see FIG. 12) are fixed to the connector body 32 with the assistance of the same structure (see FIG. 8) as the above-discussed arm portions 72 have. The pair of first wall-shaped portions 82 and the pair of second wall-shaped portions 84 are examples of the solder portion.

As illustrated in FIG. 13, portions of the pair of first wall-shaped portions 82 and the pair of second wall-shaped portions 84 on the side of the distal end portion 52T of the stem portion 52 are mountain-shaped portions 86 which extend in the shape of a mountain from the outer circumferential surface 52A of the stem portion 52. Each mountain-shaped portion 86 includes an apex portion 86P and an inclination portion 86G. The apex portion 86P is brought into press contact with the inner circumferential surface 18A of the through-hole 16. The apex portion 86P is an example of the press-contact portion.

The inclination portion 86G inclines to the center axis C of the stem portion 52 toward the distal end portion 52T of the stem portion 52 from the apex portion 86P. The inclination portions 86G like this guide the insertion of the pair of first wall-shaped portions 82 and the pair of second wall-shaped portions 84 into the through-hole 16. The inclination portion 86G is an example of the guide portion.

As illustrated in FIG. 14, the pair of first wall-shaped portions 82 extend from a one-side part of the outer circumferential surface 52A of the stem portion 52 in the same direction, and face each other. Inclination surfaces 82A are formed on the apex portions 86P of the pair of first wall-shaped portions 82, respectively.

Figure 16:
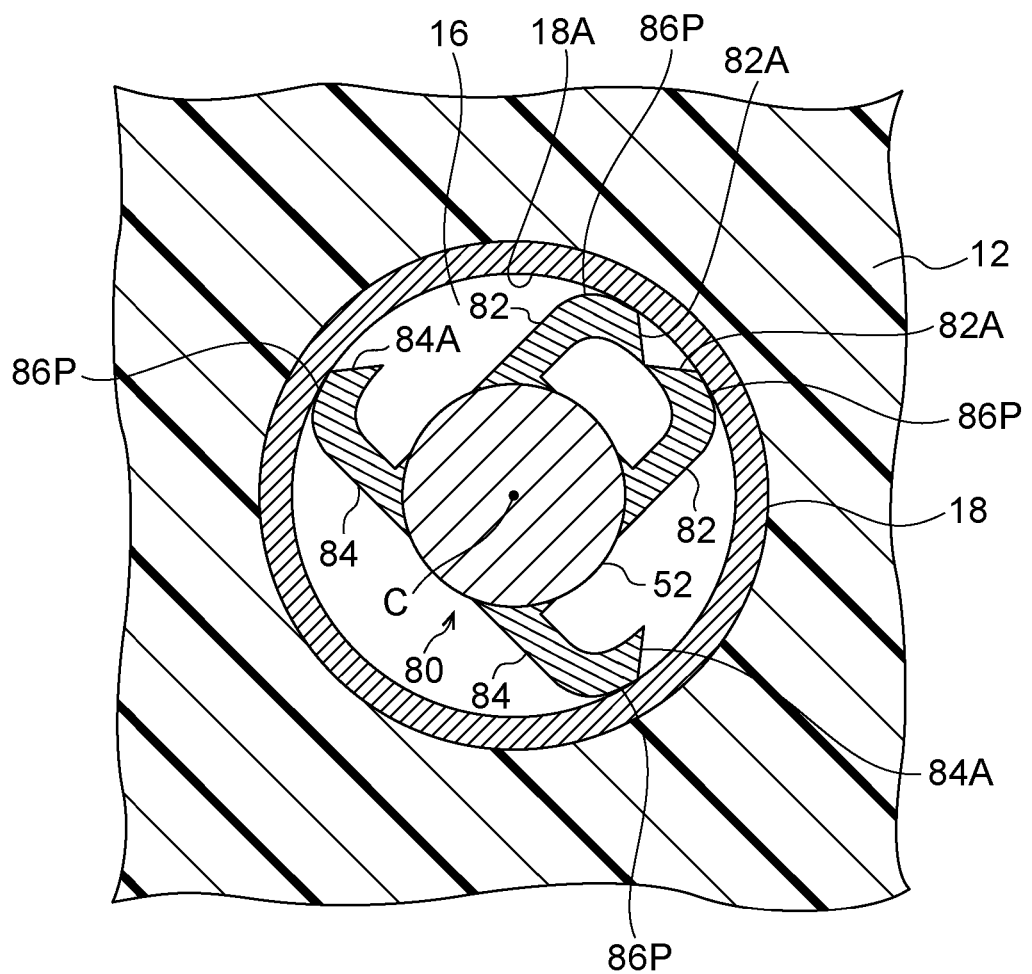
FIG. 16 is a cross-sectional view taken along the XVI-XVI line of FIG. 15.

As illustrated in FIG. 16, when the pair of first wall-shaped portions 82 are press-fitted into the through-hole 16, the inclination surfaces 82A slide over the inner circumferential surface 18A of the through-hole 16. Thus, in a transverse cross section of the positioning portion 80, the pair of first wall-shaped portions 82 are elastically deformed in a predetermined direction.

As illustrated in FIG. 14, the pair of second wall-shaped portions 84 extend from opposite parts of the outer circumferential surface 52A of the stem portion 52 in opposite directions, respectively. In the transverse cross section of the positioning portion 80, the pair of second wall-shaped portions 84 are arranged in a line. The pair of second wall-shaped portions 84 extend in a direction orthogonal or almost orthogonal to the direction in which the pair of first wall-shaped portions 82 extend. Inclination surfaces 84A are formed on the apex portions 86P of the pair of second wall-shaped portions 84.

As illustrated in FIG. 16, when the pair of second wall-shaped portions 84 are press-fitted into the through-hole 16, the inclination surfaces 84A slide over the inner circumferential surface 18A of the through-hole 16. Thus, in the transverse cross section of the positioning portion 80, the pair of second wall-shaped portions 84 are elastically deformed in a predetermined direction.

(Working and Effects)

Next, descriptions will be provided for working and effects of the third embodiment.

In the third embodiment, the pair of first wall-shaped portions 82 and the pair of second wall-shaped portions 84 are arranged around the stem portion 52 of each positioning portion 80. As illustrated in FIG. 15, the pair of first wall-shaped portions 82 and the pair of second wall-shaped portions 84 are press-fitted into the through-hole 16 with the connection terminals 42 of the connector body 32 placed on the terminal solder portions 14.

Thereby, the apex portions 86P of the pair of first wall-shaped portions 82 and the pair of second wall-shaped portions 84 are squeezed and brought into press contact with the inner circumferential surface 18A of the through-hole 16. The pair of first wall-shaped portions 82 and the pair of second wall-shaped portions 84 fix the connector body 32 to the circuit board 12. Thus, before the reflowing of the circuit board 12 and the surface-mount connector 30, the connection terminals 42 are inhibited from being out of alignment with the terminal solder portions 14.

The pair of first wall-shaped portions 82 and the pair of second wall-shaped portions 84 each include the inclination portion 86G which inclines to the center axis C of the stem portion 52 toward the distal end portion 52T of the stem portion 52 from the corresponding apex portion 86P. This makes it easy for the worker to insert the pair of first wall-shaped portions 82 and the pair of second wall-shaped portions 84 into the through-hole 16.

The apex portions 86P of the pair of first wall-shaped portions 82 are provided with the inclination surfaces 82A, while the apex portions 86P of the pair of second wall-shaped portions 84 are provided with the inclination surfaces 84A. As illustrated in FIG. 16, when the pair of first wall-shaped portions 82 and the pair of second wall-shaped portions 84 are press-fitted into the through-hole 16, the inclination surfaces 82A, 84A slide over the inner circumferential surface 18A of the through-hole 16. This makes it easy for the pair of first wall-shaped portions 82 and the pair of second wall-shaped portions 84 to be elastically deformed inside the through-hole 16. Accordingly, it is possible for the worker to easily press-fit the pair of first wall-shaped portions 82 and the pair of second wall-shaped portions 84 into the through-hole 16.

The pair of first wall-shaped portions 82 and the pair of second wall-shaped portions 84 melt when heated at or above the predetermined temperature in the reflow furnace. This unfixes the surface-mount connector 30 from the circuit board 12. Thus, due to the weights of the weight 22 and the surface-mount connector 30, the connection terminals 42 easily settle into the terminal solder portions 14. Accordingly, the connection terminals 42 are inhibited from being inappropriately joined to the terminal solder portions 14.

When cooled, the pair of first wall-shaped portions 82 and the pair of second wall-shaped portions 84 are joined to the inner circumferential surfaces 18A of the through-holes 16. This increases the strength of boding between the circuit board 12 and the surface-mount connector 30. Thus, the connection terminals 42 are inhibited from coming off the terminal solder portions 14.

(Modifications of Third Embodiment)

Next, descriptions will be provided for modifications of the third embodiment.

Figure 17:
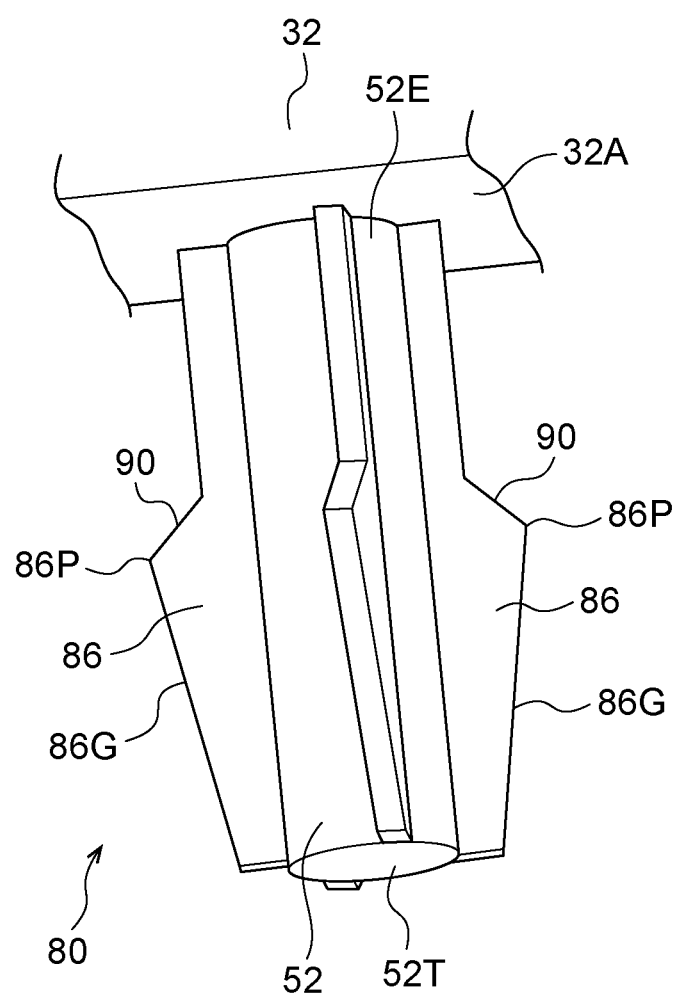
FIG. 17 is a perspective view illustrating the positioning portion of the surface-mount connector according to the third embodiment.
Figure 18:
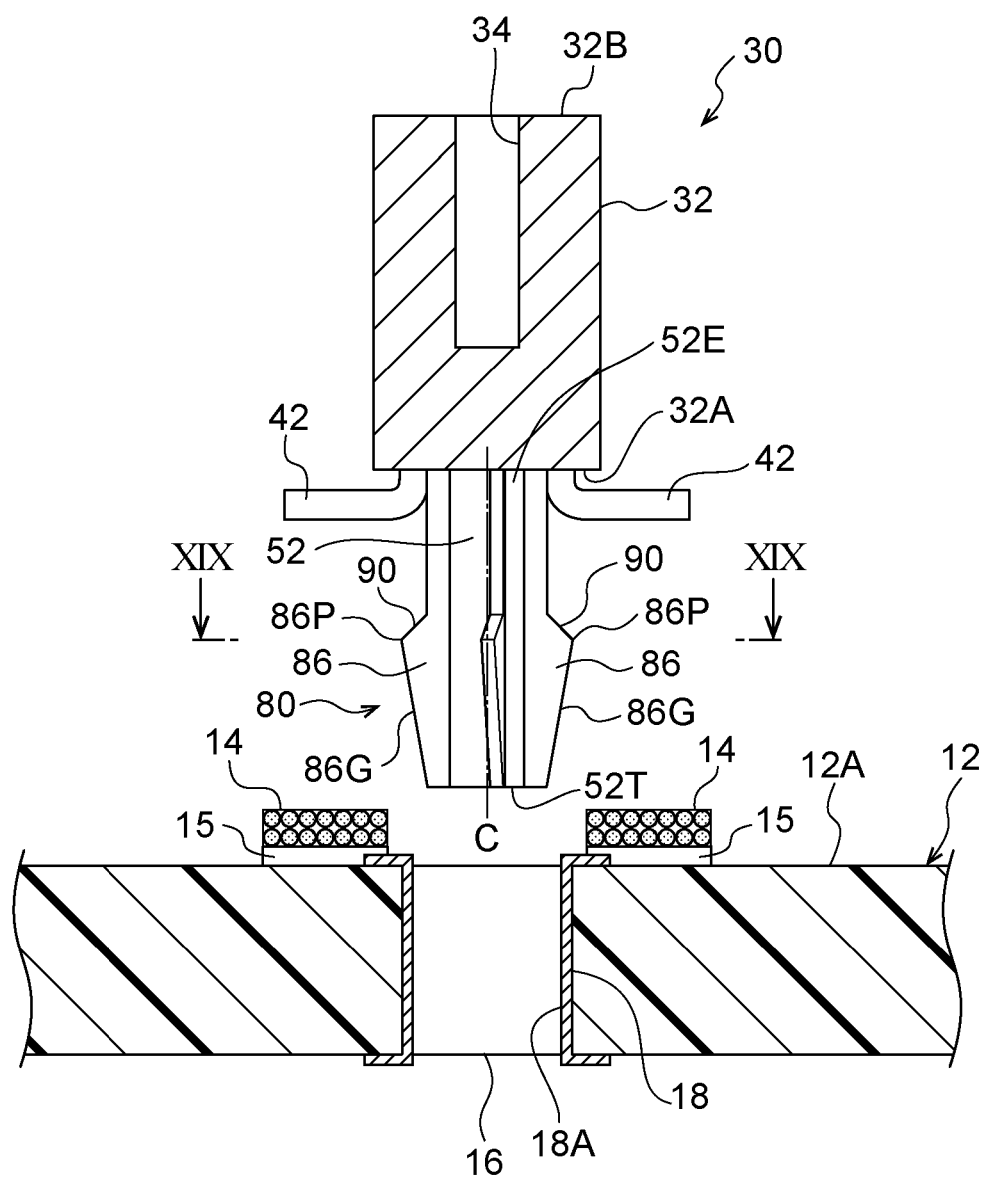
FIG. 18 is a cross-sectional view illustrating the positioning portion illustrated in FIG. 17, and corresponding to FIG. 2.
Figure 19:
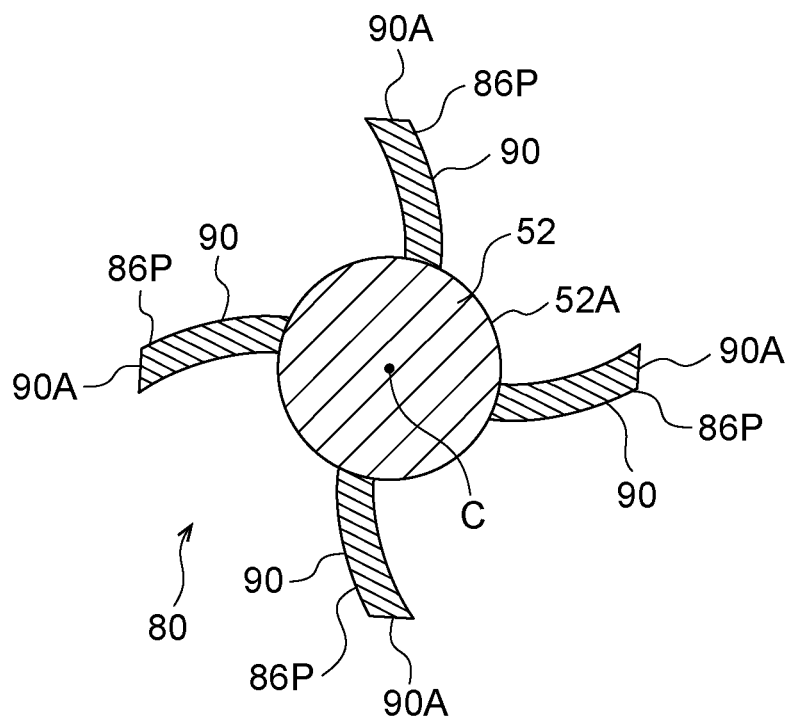
FIG. 19 is a cross-sectional view taken along the XIX-XIX line of FIG. 18.
Figure 20:
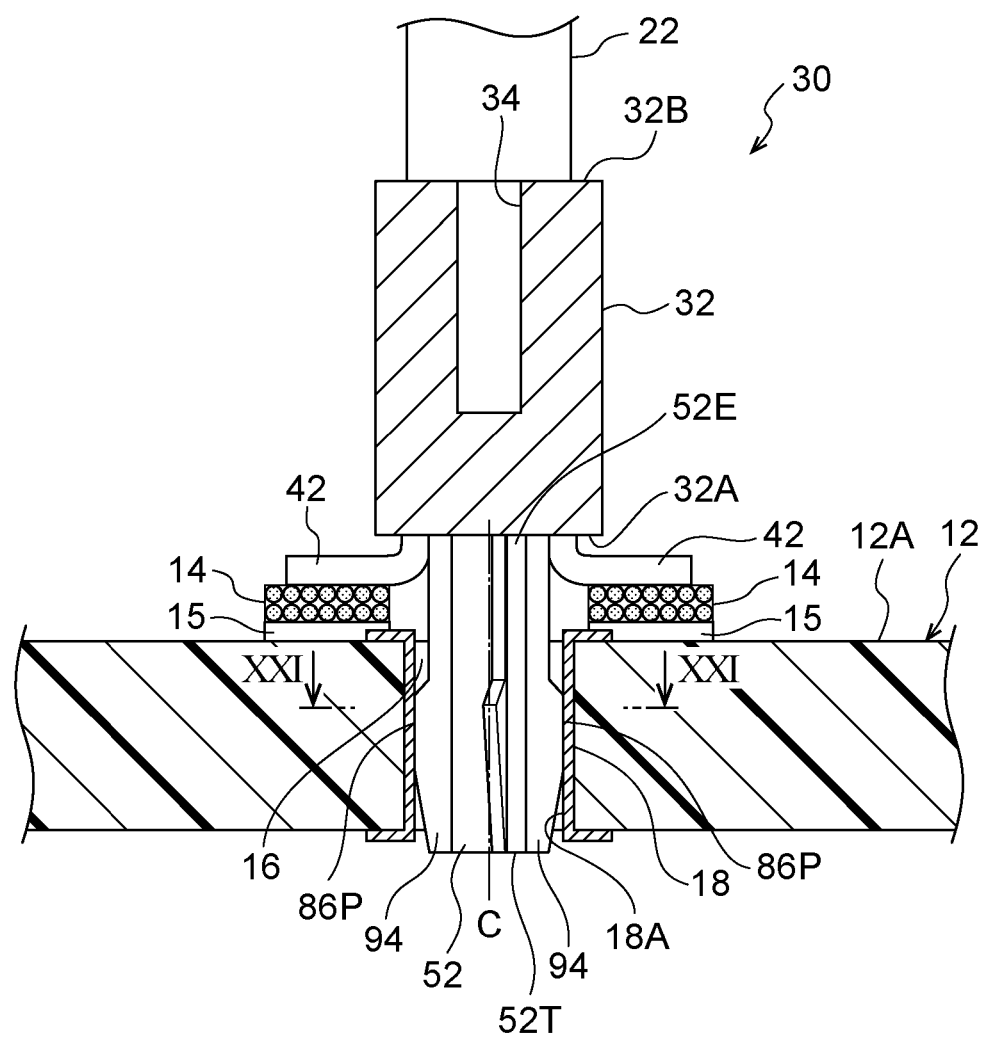
FIG. 20 is a cross-sectional view illustrating how the positioning portion illustrated in FIG. 18 is press-fitted into the through-hole of the circuit board.

In a modification illustrated in FIGS. 17 and 18, multiple (four) wall-shaped portions 90 are provided to the stem portion 52 of the positioning portion 80. As illustrated in FIG. 19, the multiple wall-shaped portions 90 extend out from the outer circumferential surface 52A of the stem portion 52 in a radial pattern going out from the center axis C of the stem portion 52. The multiple wall-shaped portions 90 are curved toward one side in the circumferential direction of the stem portion 52. As illustrated in FIG. 20, the wall-shaped portions 90 are press-fitted into the through-hole 16. The wall-shaped portions 90 are an example of the solder example.

Figure 21:
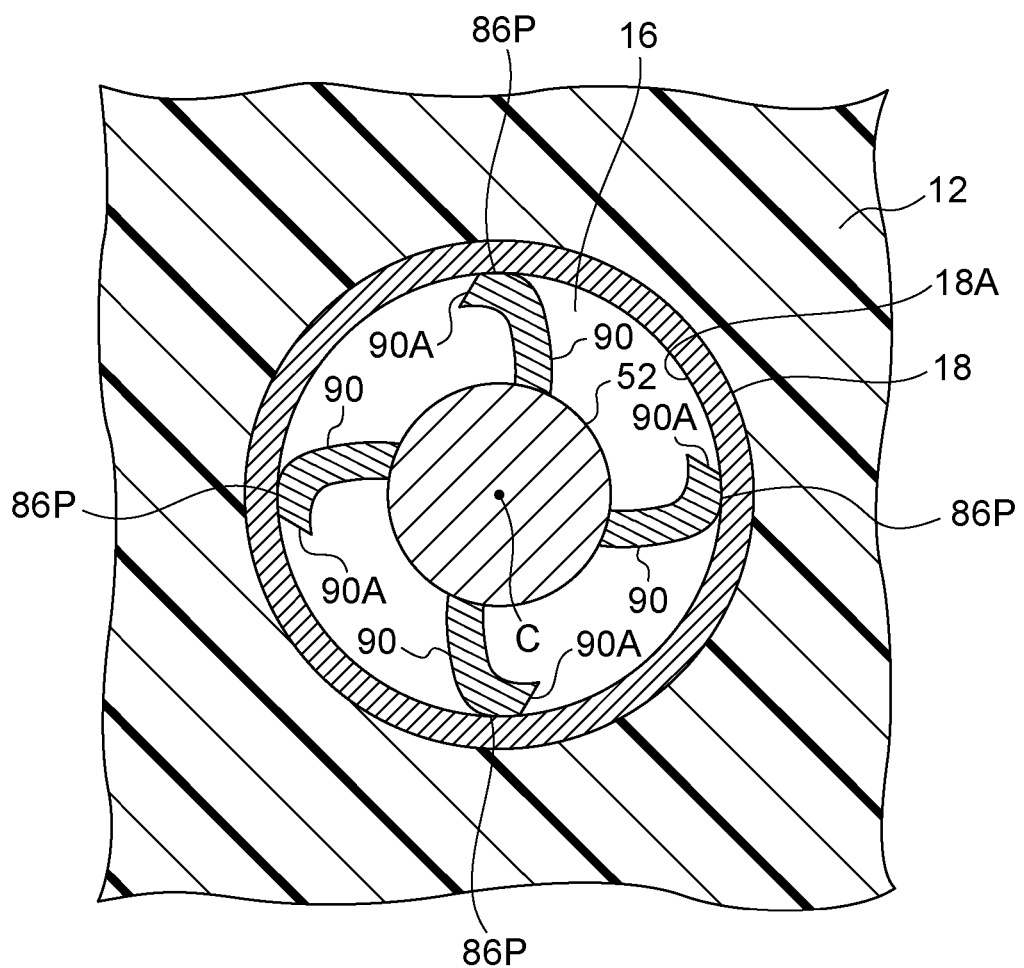
FIG. 21 is a cross-sectional view taken along the XXI-XXI line of FIG. 20.

As illustrated in FIG. 19, an inclination surface 90A is formed on the apex portion 86P of each wall-shaped portion 90. As illustrated in FIG. 21, the inclination surfaces 90A slide over the inner circumferential surface 18A of the through-hole 16 when the wall-shaped portions 90 are press-fitted into the through-hole 16. Thereby, in the transverse cross section of the positioning portion 80, the multiple wall-shaped portions 90 are elastically deformed toward the one side in the circumferential direction of the stem portion 52.

As discussed above, in this modification, the multiple wall-shaped portions 90 extend out from the outer circumferential surface 52A of the stem portion 52 in a radial pattern going out from the center axis C of the stem portion 52. This makes it easy for the stem portion 52 to be arranged in the through-hole 16 in a way that makes the center of the stem portion coincide with the center of the through-hole when the multiple wall-shaped portions 90 are press-fitted into the through-hole 16. Accordingly, the accuracy of positioning the connection terminals 42 of the connector body 32 relative to the terminal solder portions 14 on the circuit board 12 increases.

Figure 22:
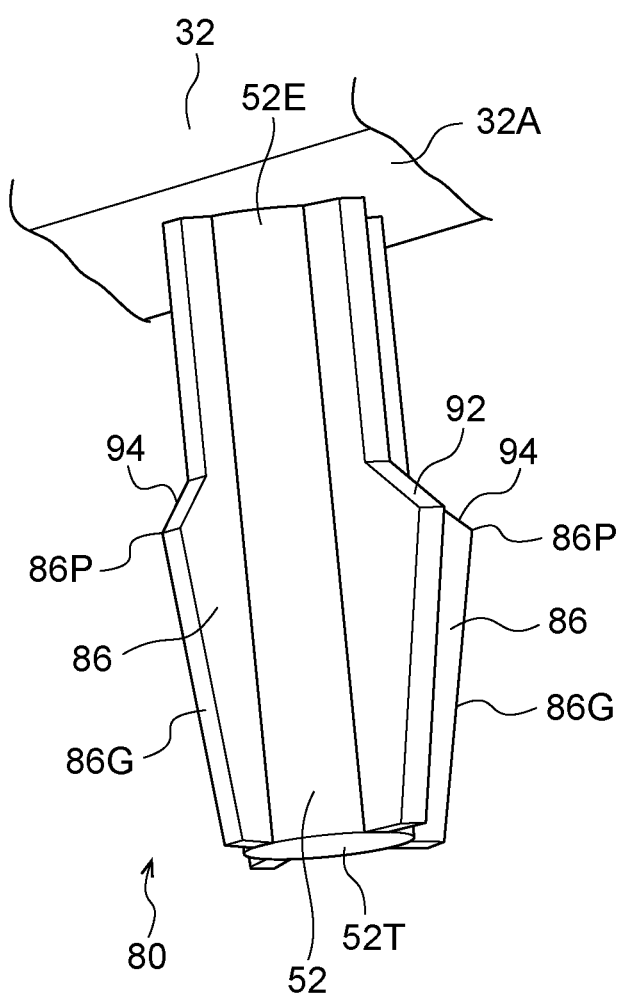
FIG. 22 is a perspective view illustrating the positioning portion of the surface-mount connector according to the third embodiment.
Figure 23:
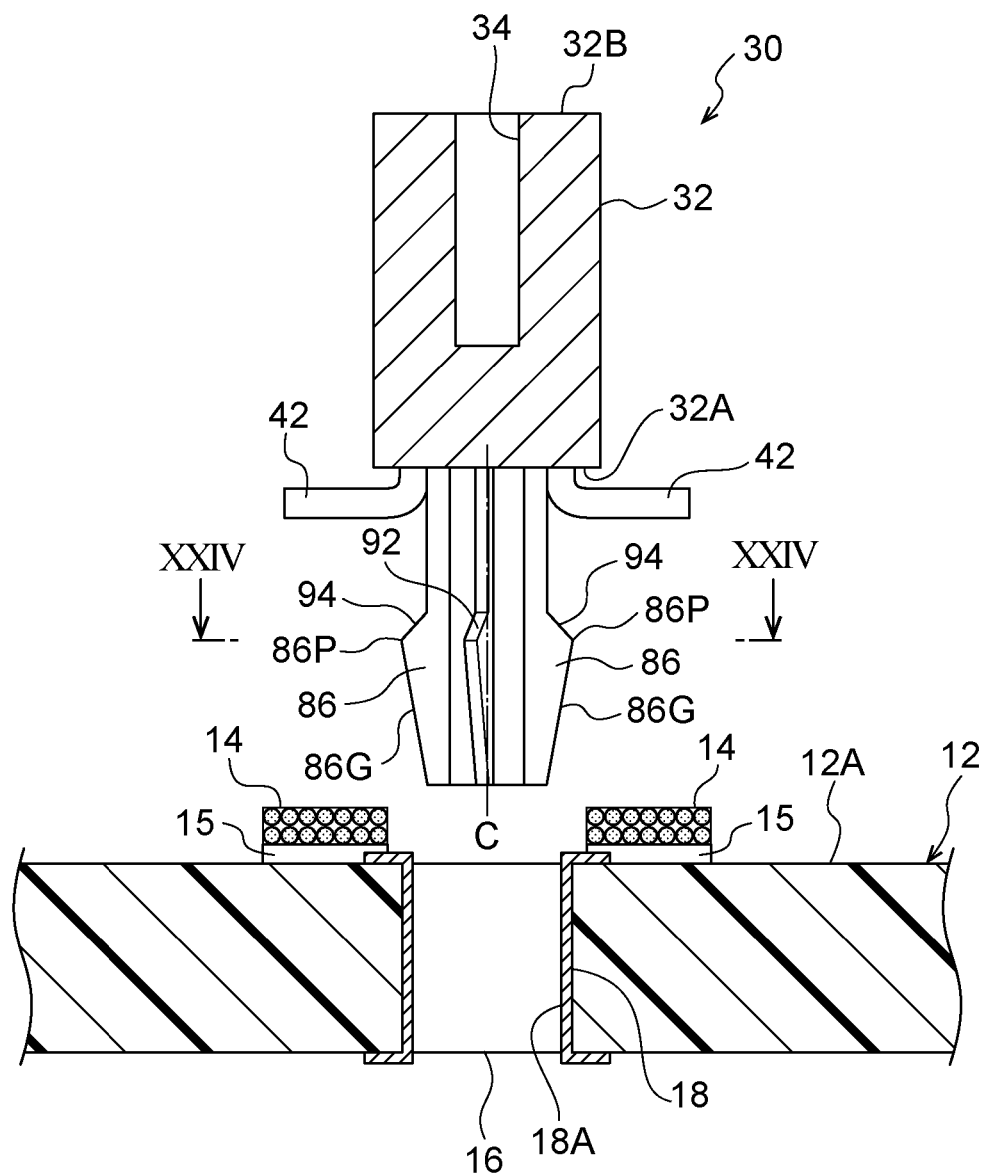
FIG. 23 is a cross-sectional view illustrating the positioning portion illustrated in FIG. 22, and corresponding to FIG. 2.

The direction in which the multiple wall-shaped portions extend out from the outer circumferential surface 52A of the stem portion 52 may be changed depending on the necessity. For example, in a modification illustrated in FIGS. 22 and 23, a pair of wall-shaped portions 92, and a pair of wall-shaped portions 94 extend out from the outer circumferential surface 52A of the stem portion 52.

Figure 24:
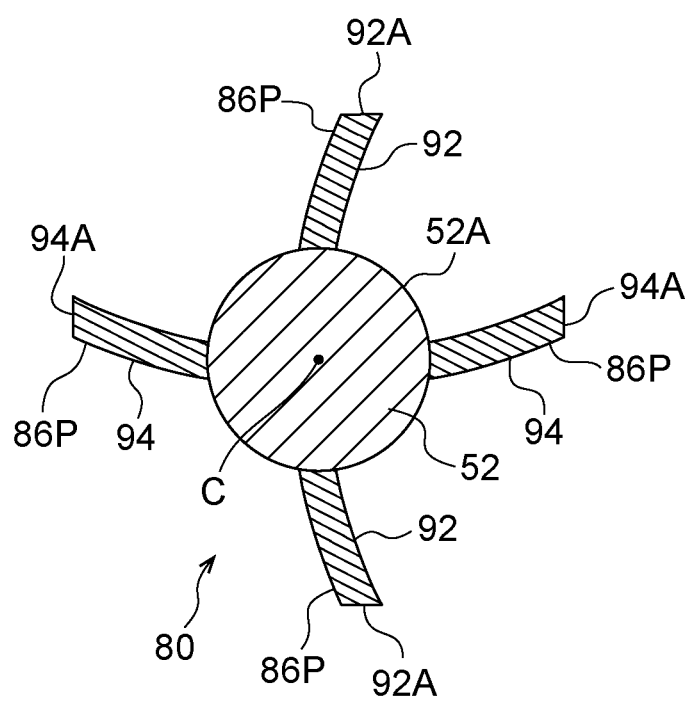
FIG. 24 is a cross-sectional view taken along the XXIV-XXIV line of FIG. 23.

As illustrated in FIG. 24, the pair of wall-shaped portions 92 extend out toward two sides of the stem portion 52, and are arranged on the circumference of the same circle. Inclinations surfaces 92A are formed on the apex portions 86P of the pair of wall-shaped portions 92. Similarly, the pair of wall-shaped portions 94 extend out toward the other two sides of the stem portion 52, and are arranged on the circumference of the same circle. Inclinations surfaces 94A are formed on the apex portions 86P of the pair of wall-shaped portions 94.

Figure 25:
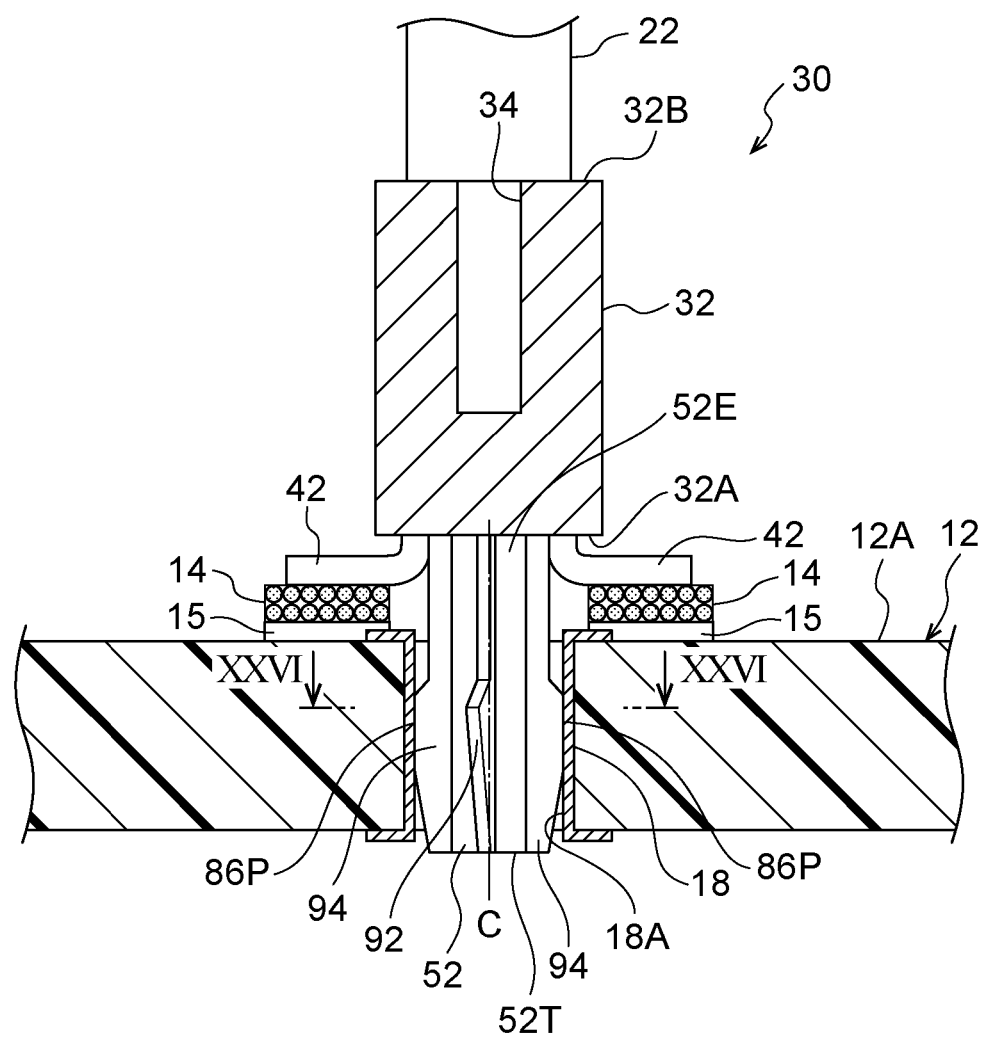
FIG. 25 is a cross-sectional view illustrating how the positioning portion illustrated in FIG. 24 is press-fitted into the through-hole of the circuit board.
Figure 26:
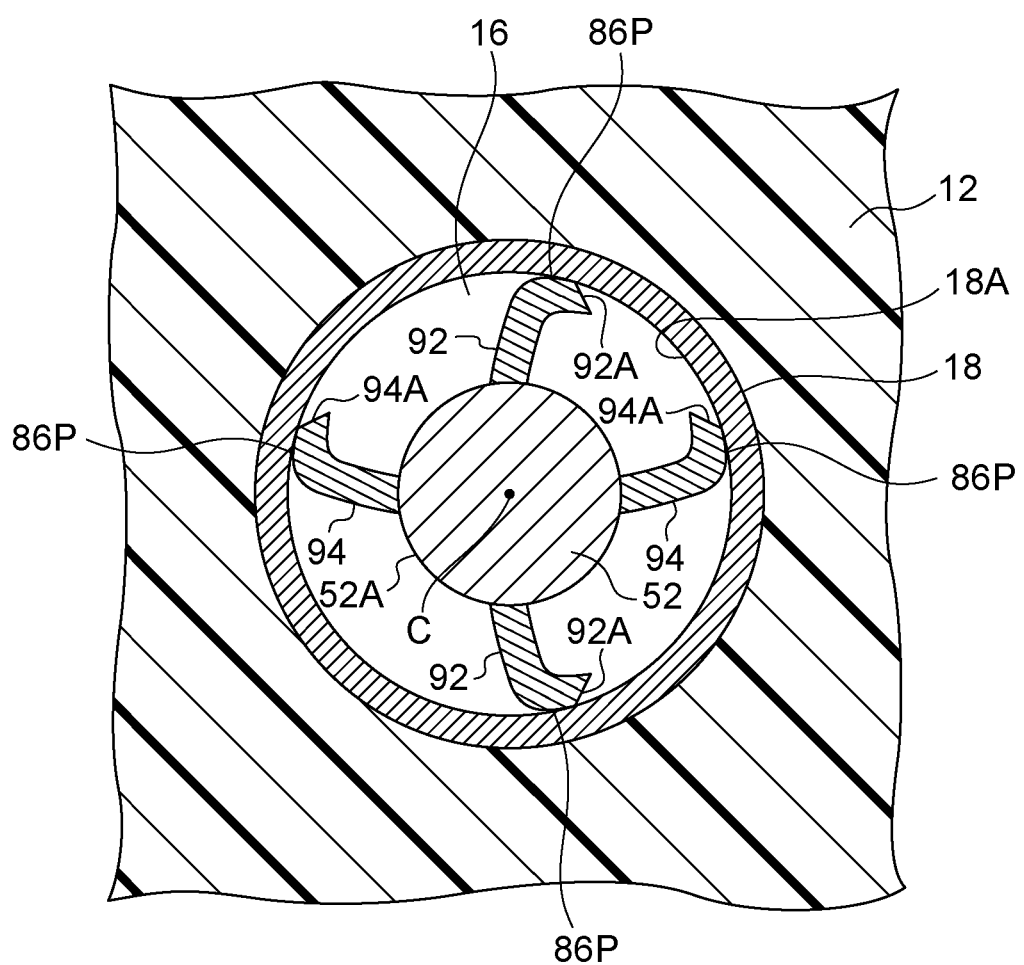
FIG. 26 is a cross-sectional view taken along the XXVI-XXVI line of FIG. 25.

Thereby, as illustrated in FIGS. 25 and 26, when the pair of wall-shaped portions 92 and the pair of wall-shaped portions 94 are press-fitted into the through-hole 16, the pair of wall-shaped portions 92 and the pair of wall-shaped portions 94 are elastically deformed in the respective predetermined directions. The pair of wall-shaped portions 92 and the pair of wall-shaped portions 94 are an example of the solder portion.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A surface-mount connector comprising:
a connector body;
connection terminals provided to the connector body, and configured to be placed on terminal solder portions on a surface of a circuit board; and
a positioning portion provided to the connector body, and including a stem portion configured to extend from a surface of the connector body and a solder portion configured to cover a sidewall of the stem portion,
the stem portion having the sidewall which is covered by solder portion is press-fitted into a through-hole of the circuit board with the connection terminals placed on the terminal solder portions,
wherein the solder portion includes a guide portion which inclines to a center axis of the stem portion toward a distal end portion of the stem portion.

2. The surface-mount connector according to claim 1, wherein the solder portion includes a first second taper portion configured to taper toward a base end of the stem portion on a side of the connection body and a second taper portion configured to taper toward a distal end of the stem portion on an opposite side of the connection body.

3. The surface-mount connector according to claim 1, wherein the stem portion is column-shaped.

4. The surface-mount connector according to claim 1, wherein the solder portion is cylindrical, and covering an outer circumferential surface of the stem portion.

5. The surface-mount connector according to claim 1, wherein the solder portion includes a taper portion which tapers toward a distal end portion of the stem portion.

6. The surface-mount connector according to claim 1, wherein the connector body includes an attachment portion to which to attach an electronic part.

* * * * *